(12) United States Patent
Guha et al.

(10) Patent No.: US 11,276,691 B2
(45) Date of Patent: Mar. 15, 2022

(54) GATE-ALL-AROUND INTEGRATED CIRCUIT STRUCTURES HAVING SELF-ALIGNED SOURCE OR DRAIN UNDERCUT FOR VARIED WIDTHS

(71) Applicant: Intel Corporation, Santa Clara, CA (US)

(72) Inventors: Biswajeet Guha, Hillsboro, OR (US);
Jun Sung Kang, Portland, OR (US);
Bruce Beattie, Portland, OR (US);
Stephen M. Cea, Hillsboro, OR (US);
Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 652 days.

(21) Appl. No.: 16/134,824

(22) Filed: Sep. 18, 2018

(65) Prior Publication Data

US 2020/0091145 A1      Mar. 19, 2020

(51) Int. Cl.
*H01L 27/088*      (2006.01)
*H01L 21/8234*     (2006.01)
(Continued)

(52) U.S. Cl.
CPC .. *H01L 27/0886* (2013.01); *H01L 21/823412* (2013.01); *H01L 21/823431* (2013.01);
(Continued)

(58) Field of Classification Search
CPC ............. H01L 27/0886; H01L 29/0847; H01L 29/785; H01L 2029/7857; H01L 29/0665;
(Continued)

(56) References Cited

U.S. PATENT DOCUMENTS 9,184,235 B2 * 11/2015 Brandt .................... H01L 29/20
2008/0166847 A1    7/2008 Utomo
(Continued)

FOREIGN PATENT DOCUMENTS

EP      3588545      1/2020
EP      3588578      1/2020
(Continued)

OTHER PUBLICATIONS

Search Report from European Patent Application No. 19183495.1 dated Feb. 4, 2020, 15 pages.
(Continued)

*Primary Examiner* — Changhyun Yi
(74) *Attorney, Agent, or Firm* — Scwabe, Williamson & Wyatt, P.C.

(57) ABSTRACT

Gate-all-around integrated circuit structures having self-aligned source or drain undercut for varied widths are described. In an example, a structure includes first and second vertical arrangements of nanowires above a substrate, the nanowires of the second vertical arrangement of nanowires having a horizontal width greater than a horizontal width of the nanowires of the first vertical arrangement of nanowires. First and second gate stack portions are over the first and second vertical arrangements of nanowires, respectively. First embedded epitaxial source or drain regions are at ends of the first vertical arrangement of nanowires and extend beneath dielectric sidewalls spacers of the first gate stack portion by a first distance. Second embedded epitaxial source or drain regions are at ends of the second vertical arrangement of nanowires and extend beneath the dielectric sidewalls spacers of the second gate stack portion by a second distance substantially the same as the first distance.

21 Claims, 13 Drawing Sheets

(51) Int. Cl.
*H01L 29/06* (2006.01)
*H01L 29/08* (2006.01)
*H01L 29/66* (2006.01)
*H01L 29/78* (2006.01)

(52) U.S. Cl.
CPC ............ *H01L 21/823437* (2013.01); *H01L 21/823468* (2013.01); *H01L 21/823481* (2013.01); *H01L 29/0673* (2013.01); *H01L 29/0847* (2013.01); *H01L 29/6653* (2013.01); *H01L 29/66545* (2013.01); *H01L 29/66795* (2013.01); *H01L 29/785* (2013.01); *H01L 2029/7858* (2013.01)

(58) Field of Classification Search
CPC ............ H01L 29/0673; H01L 29/0653; H01L 29/78696
See application file for complete search history.

(56) References Cited

U.S. PATENT DOCUMENTS

| | | | |
|---|---|---|---|
| 2014/0197377 A1* | 7/2014 | Kim | H01L 27/1211 257/29 |
| 2015/0041899 A1 | 2/2015 | Yang | |
| 2018/0047832 A1 | 2/2018 | Tapily | |

FOREIGN PATENT DOCUMENTS

| | | |
|---|---|---|
| WO | WO 2018/063259 | 4/2018 |
| WO | WO 2018/063314 | 4/2018 |

OTHER PUBLICATIONS

Office Action from European Patent Application No. 19183495.1 dated Sep. 3, 2021, 7 pages.

* cited by examiner

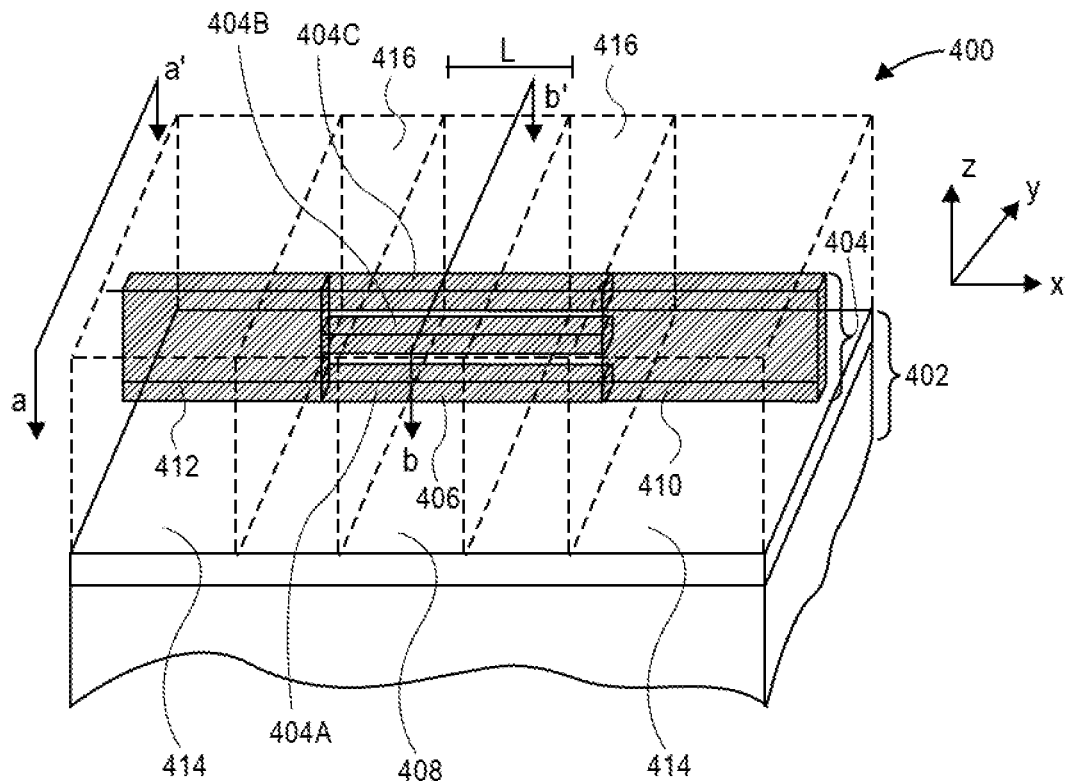
FIG. 4A
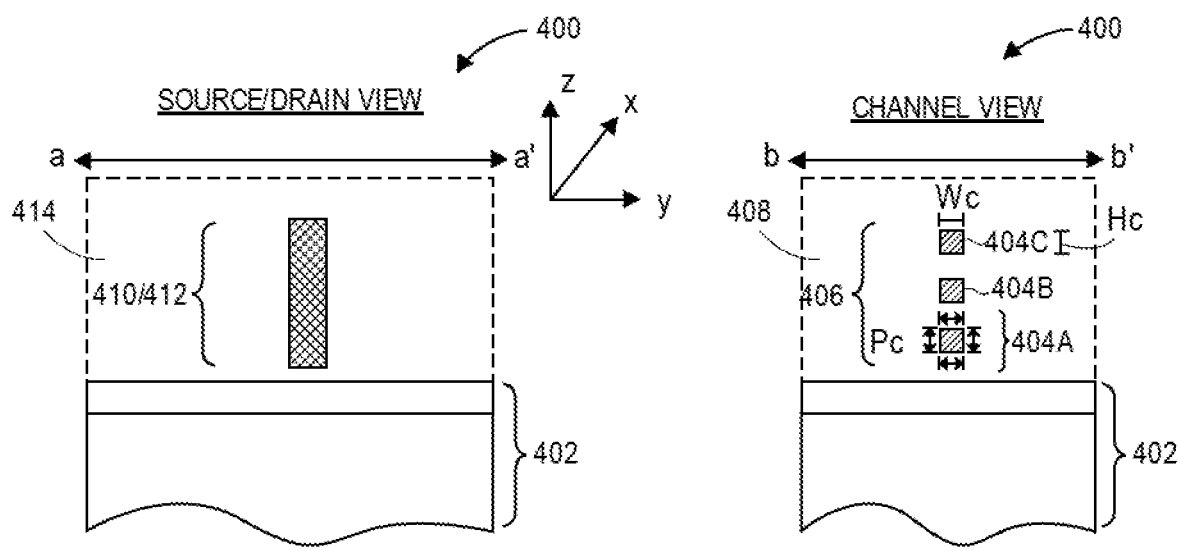
FIG. 4B          FIG. 4C

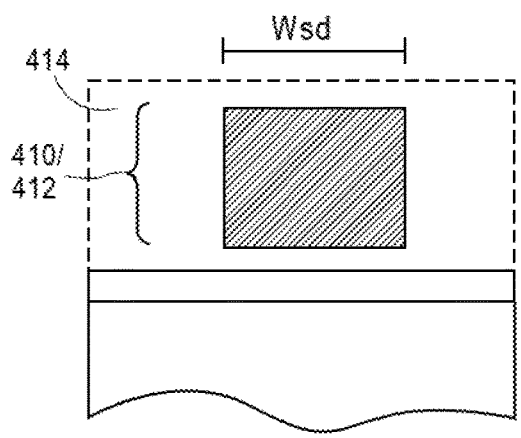
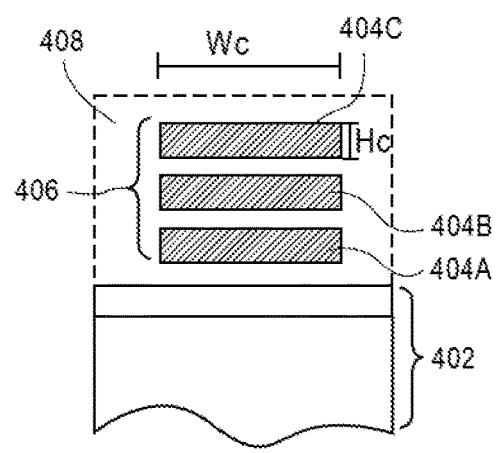
FIG. 5A
FIG. 5B
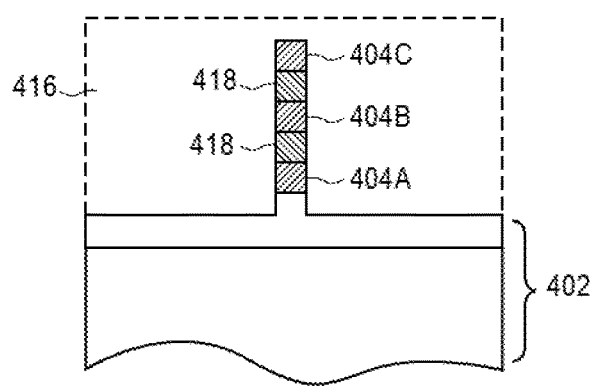
FIG. 6

GATE-ALL-AROUND INTEGRATED CIRCUIT STRUCTURES HAVING SELF-ALIGNED SOURCE OR DRAIN UNDERCUT FOR VARIED WIDTHS

TECHNICAL FIELD

Embodiments of the disclosure are in the field of semiconductor devices and processing and, in particular, gate-all-around integrated circuit structures having self-aligned source or drain undercut for varied widths, and methods of fabricating gate-all-around integrated circuit structures having self-aligned source or drain undercut for varied widths.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 4A illustrates a three-dimensional cross-sectional view of a nanowire-based semiconductor structure, in accordance with an embodiment of the present disclosure.

FIG. 4B illustrates a cross-sectional source or drain view of the nanowire-based semiconductor structure of FIG. 4A, as taken along the a-a' axis, in accordance with an embodiment of the present disclosure.

FIG. 4C illustrates a cross-sectional channel view of the nanowire-based semiconductor structure of FIG. 4A, as taken along the b-b' axis, in accordance with an embodiment of the present disclosure.

FIG. 5A illustrates a cross-sectional source or drain view of another nanowire-based semiconductor structure, in accordance with an embodiment of the present disclosure.

FIG. 5B illustrates a cross-sectional channel view of the nanowire-based semiconductor structure of FIG. 8A, in accordance with an embodiment of the present disclosure.

FIG. 6 illustrates a cross-sectional spacer view of a nanowire-based semiconductor structure, in accordance with an embodiment of the present disclosure.

DESCRIPTION OF THE EMBODIMENTS

Figure 1A:
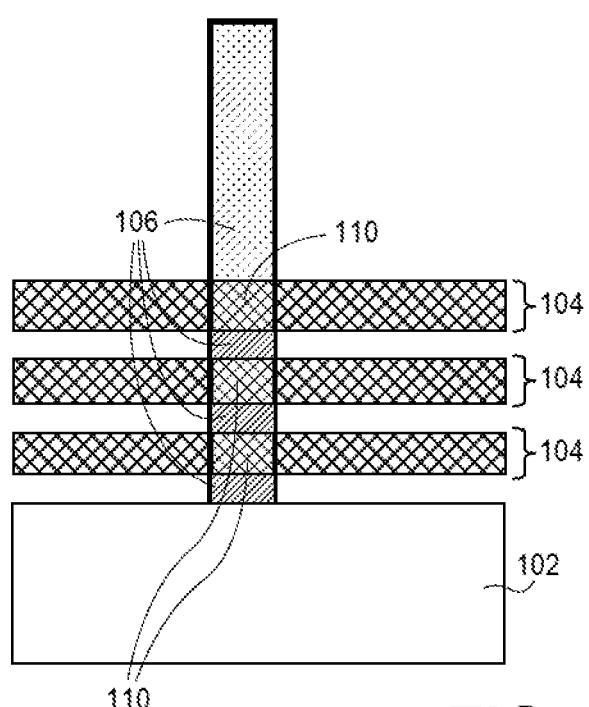
FIGS. 1A-1F illustrate cross-sectional views (gate cut) and corresponding plan views representing various operations in a method of fabricating a gate-all-around integrated circuit structures having self-aligned source or drain undercut for varied widths, in accordance with an embodiment of the present disclosure.
Figure 1A:
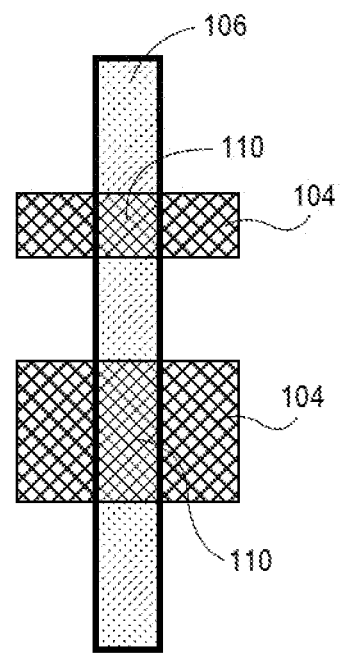

Gate-all-around integrated circuit structures having self-aligned source or drain undercut for varied widths, and methods of fabricating gate-all-around integrated circuit structures having self-aligned source or drain undercut for varied widths, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for achieving self-aligned lateral source or drain epitaxial (EPI) undercut for multiple width (multi-Wsi) nanoribbon/nanowire structures.

To provide context, a lateral EPI undercut etch (EUC) is needed to accurately position tips of embedded epitaxial source or drain structure with respect to a gate edge. With nanoribbons/nanowires of different silicon width (Wsi), state-of-the-art processing results in undercut etching to different extents due to an inherent Wsi dependence. The difference in extents of undercut etching may ultimately lead to sub-optimal tip resistance and/or short channel effects (SCEs).

In accordance with an embodiment of the present disclosure, process flows are described below that enable a self-aligned lateral epitaxial undercut etch independent or substantially independent of Wsi. Implementation of embodiments described herein may enables robust functionality of next generation nanowire-based transistors with low power, high performance. It is to be appreciated that, as used herein, the term nanowire-based transistors may also be used to encompass nanoribbon-based transistors.

As an exemplary process flow, FIGS. 1A-1F illustrate cross-sectional views (gate cut) and corresponding plan views representing various operations in a method of fabricating a gate-all-around integrated circuit structures having self-aligned source or drain undercut for varied widths, in accordance with an embodiment of the present disclosure.

Referring to FIG. 1A, a method of fabricating an integrated circuit structure includes forming a first vertical arrangement of nanowires (top set of 104s in the plan view) and a second vertical arrangement of nanowires (bottom set of 104s in the plan view) above a substrate 102. The nanowires of the second vertical arrangement of nanowires have a horizontal width (dimension along top to bottom of page in plan view) greater than a horizontal width of the nanowires of the first vertical arrangement of nanowires. The structure includes a gate stack 106, which may be a dummy gate stack at this stage of processing. A first gate stack portion is formed over the first vertical arrangement of nanowires (top set of 104s in the plan view) and a second gate stack portion (bottom set of 104s in the plan view) is formed over the second vertical arrangement of nanowires. The gate stack 106 defines channel regions 110 in the nanowires 104. It is to be appreciated that the nanowires 104 may not be released from an initial fin structure until after formation of gate stack 106, an exemplary process of which is described in greater detail below. It is also to be appreciated that a top down view of the left-hand structure of FIG. 1A would show gate stack 106 as masking channel regions 110, however, in the plan view channel regions 110 are shown as if through a partially transparent gate stack 106 for illustrative purposes.

Figure 1B:
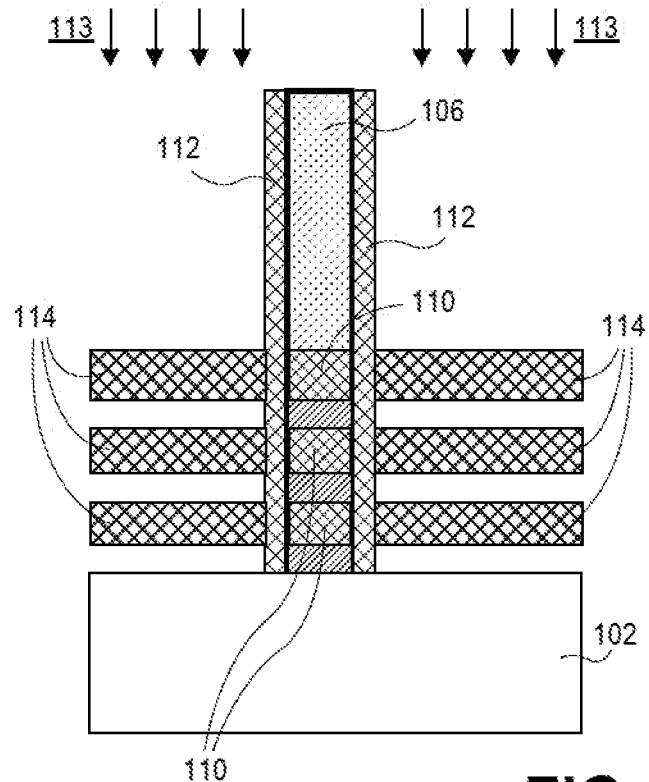
Figure 1B:
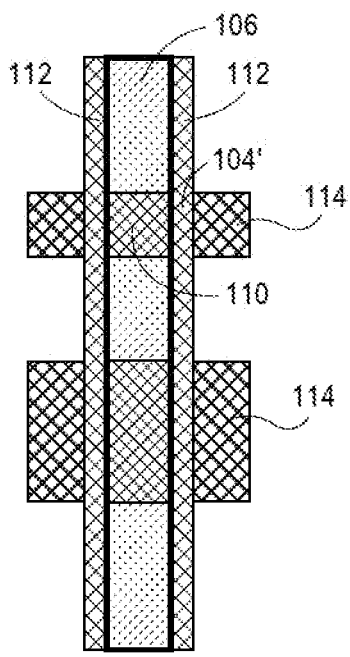

Referring to FIG. 1B, first dielectric sidewall spacers 112 are formed along the first and second gate stack portions of gate stack 106. Impurity atoms 113 are then implanted into portions of the first vertical arrangement of nanowires 104 and the second vertical arrangement of nanowires 104 that are not covered by the first dielectric sidewall spacers 112 to form implanted portions 114 and to leave non-implanted portions 104' of the nanowires 104 outside of the channel regions 110. In an embodiment, impurity atoms are atoms that accelerate an etch rate of the material of the nanowires 104 with respect to a selected etch process. In one embodiment, impurity atoms 113 are phosphorous or arsenic atoms implanted into silicon nanowires to accelerate a silicon wet etch process relative to non-implanted portions 104' of the nanowires 104. It is to be appreciated that for first dielectric sidewall spacers 112 may need to be patterned (e.g., reduced) for NMOS relative to PMOS structures, or vice versa, if different extents of undercut are desired for NMOS versus PMOS structures. It is also to be appreciated that a top down view of the left-hand structure of FIG. 1B would show gate stack 106 and first dielectric sidewall spacers 112 as masking channel regions 110 and non-implanted portions 104', however, in the plan view channel regions 110 are shown as if through a partially transparent gate stack 106, and a label for non-implanted portions 104' is included, for illustrative purposes.

Figure 1C:
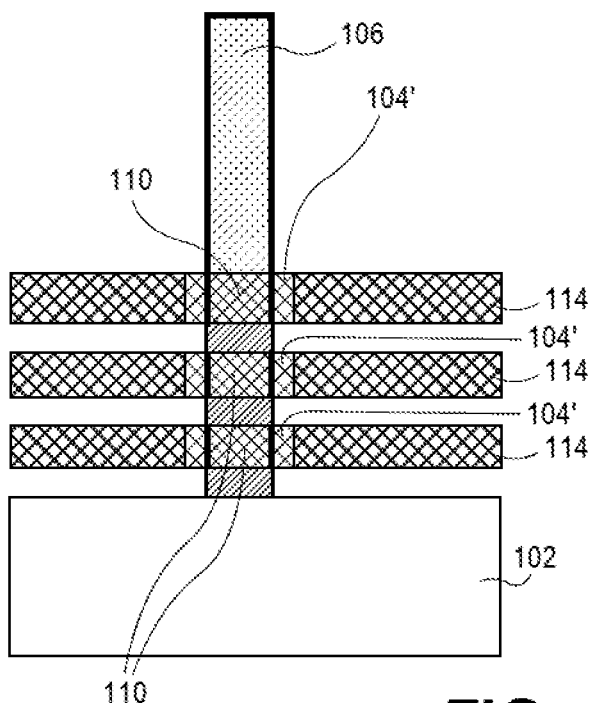
Figure 1C:
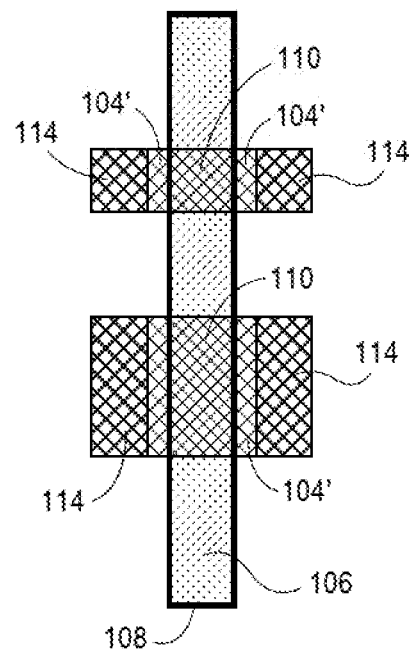

Referring to FIG. 1C, in an embodiment, the first dielectric sidewall spacers 112 are removed to reveal the non-implanted portions 104'. It is to be appreciated that a top down view of the left-hand structure of FIG. 1C would show gate stack 106 (which may include a dielectric 108, such as a gate dielectric material) as masking channel regions 110, however, in the plan view channel regions 110 are shown as if through a partially transparent gate stack 106 for illustrative purposes. In an alternative embodiment, the first dielectric sidewall spacers 112 are not removed.

Figure 1D:
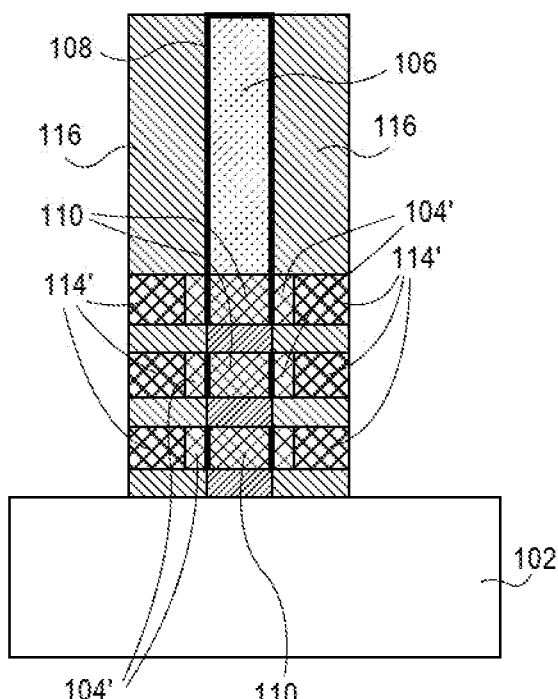
Figure 1D:
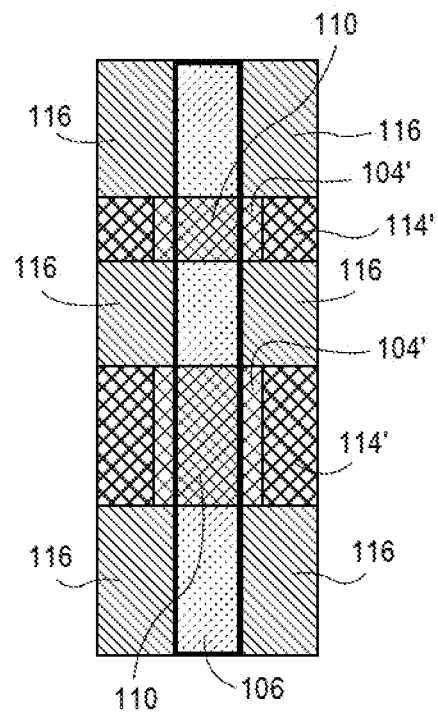

Referring to FIG. 1D, second dielectric sidewall spacers 116 are formed along the first and second gate stack portions of the gate stack 106. In an embodiment, as is depicted, portions of the implanted portions 114 of nanowires 104 outside of coverage of the second dielectric sidewall spacers 116 are removed, e.g., during anisotropic etching used to form second dielectric sidewall spacers 116. It is to be appreciated that a top down view of the left-hand structure of FIG. 1D would show gate stack 106 masking channel regions 110, and would show second dielectric sidewall spacers 116 masking non-implanted portions 104' and implanted portions 114, however, in the plan view channel regions 110 are shown as if through a partially transparent gate stack 106, and non-implanted portions 104' and implanted portions 114 are shown as if through partially transparent second dielectric sidewall spacers 116, for illustrative purposes.

Figure 1E:
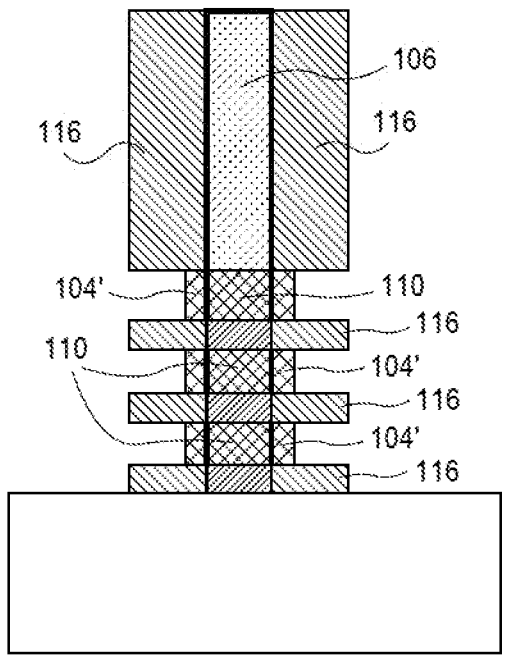
Figure 1E:
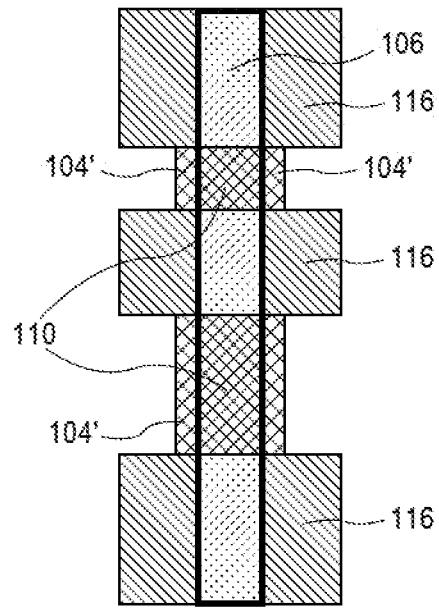

Referring to FIG. 1E, the portions (or remaining portions) 114' of the first vertical arrangement of nanowires and the second vertical arrangement of nanowires implanted with the impurity atoms are removed to form recessed ends of the first and second vertical arrangements of nanowires. In an embodiment, the recessed ends correspond to ends of the non-implanted portions 104' of the nanowires 104. In an embodiment, the portions (or remaining portions) 114' of the nanowires 104 are removed with a wet etch process that has a substantially faster etch rate for the portions (or remaining portions) 114' than the non-implanted portions 104' of nanowires 104. It is to be appreciated that a top down view of the left-hand structure of FIG. 1E would show gate stack 106 masking channel regions 110, and would show second dielectric sidewall spacers 116 masking non-implanted portions 104' and the exposed ends of non-implanted portions 104', however, in the plan view channel regions 110 are shown as if through a partially transparent gate stack 106, and non-implanted portions 104' and the exposed ends of non-implanted portions 104' are shown as if through partially transparent second dielectric sidewall spacers 116, for illustrative purposes.

Figure 1F:
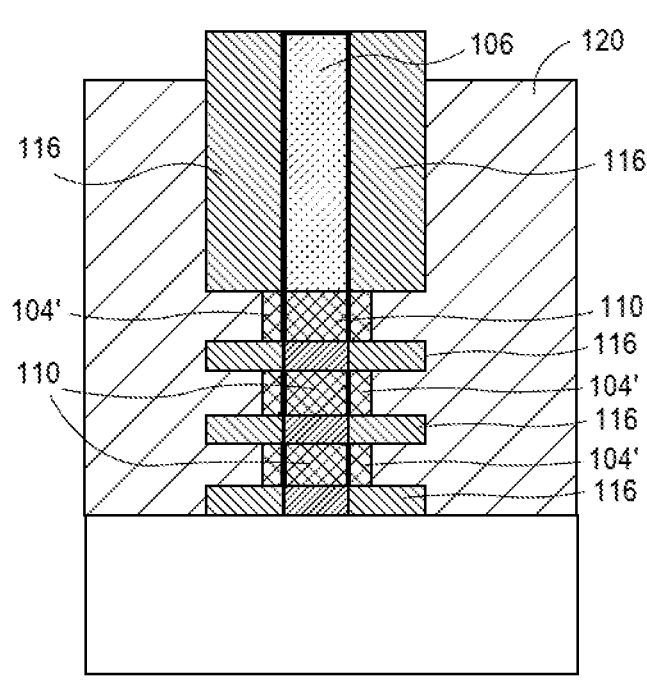
Figure 1F:
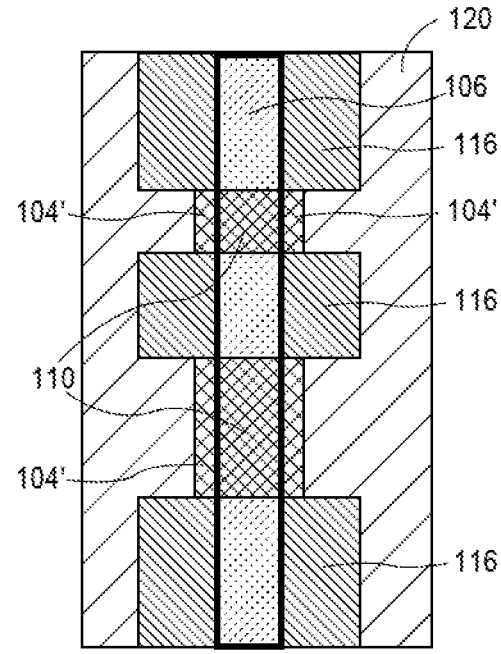

Referring to FIG. 1F, first embedded epitaxial source or drain regions (upper portion of 120 in plan view) are formed at the recessed ends 104' of the first vertical arrangement of nanowires 104. The first embedded epitaxial source or drain regions extend beneath the second dielectric sidewalls spacers 116 by a first distance. Second embedded epitaxial source or drain regions (lower portion of 120 in plan view) are formed at the recessed ends 104' of the second vertical arrangement of nanowires 104. The second embedded epitaxial source or drain regions extend beneath the second dielectric sidewalls spacers 116 by a second distance the same or substantially the same as the first distance. It is to be appreciated that a top down view of the left-hand structure of FIG. 1F would show gate stack 106 masking channel regions 110, and would show second dielectric sidewall spacers 116 masking non-implanted portions 104' and the embedded portions of the epitaxial source or drain regions 120, however, in the plan view channel regions 110 are shown as if through a partially transparent gate stack 106, and non-implanted portions 104' and the and the embedded portions of the epitaxial source or drain regions 120 are shown as if through partially transparent second dielectric sidewall spacers 116, for illustrative purposes.

Referring again to FIG. 1F, and in accordance with an embodiment of the present disclosure, the first embedded epitaxial source or drain regions (upper portion of 120 in plan view) formed at the recessed ends 104' of the first vertical arrangement of nanowires (wires associated with channel regions 110 at the upper portion of the plan view of FIG. 1F) are each non-discrete source or drain structures in that they are each a vertically unified structure for a vertical arrangement of nanowires (as is depicted in the cross-sectional view of FIG. 1F). In one embodiment, as depicted, each of the non-discrete first embedded epitaxial source or drain regions are merged with corresponding non-discrete source or drain structures second embedded epitaxial source or drain regions (lower portion of 120 in plan view) formed at the recessed ends 104' of the second vertical arrangement of nanowires (wires associated with channel regions 110 at the lower portion of the plan view of FIG. 1F).

In another embodiment, not depicted, the first embedded epitaxial source or drain regions formed at the recessed ends 104' of the first vertical arrangement of nanowires are non-discrete source or drain structures that are not merged with non-discrete source or drain structures second embedded epitaxial source or drain regions formed at the recessed ends 104' of the second vertical arrangement of nanowires. In yet another embodiment, not depicted, the embedded epitaxial source or drain regions are discrete source or drain structures in that they are each a vertically non-unified structure for a vertical arrangement of nanowires, where a subsequently formed corresponding conductive contact ultimately electrically couples individual ones of the discrete source or drain structures.

In an embodiment, the first and second gate stack portions of gate stack 106 are subsequently replaced with permanent first and second gate stack portions including a high-k gate dielectric layer and a metal gate electrode, e.g., a replacement gate process is performed subsequent to an epi undercut process as described above with respect to FIGS. 1A-1F. In another embodiment, however, the epi undercut process is performed subsequent to a replacement gate process, an example processing scheme for which is described below in association with FIGS. 7A-7E.

In an embodiment, as is depicted in FIG. 1F, the first gate stack portion and the second gate stack portion are included in a same gate stack 110. In another embodiment, not depicted, the first gate stack portion and the second gate stack portion are included in a first gate stack and a second gate stack, respectively, the first gate stack and the second gate stack isolated from one another.

In an embodiment, the nanowires 104 of the first vertical arrangement of nanowires are over a first fin, and the nanowires 104 of the second vertical arrangement of nanowires is over a second fin, exemplary structures of which are described below. In an embodiment, residual impurity atoms 113 are disposed in regions around the structure of FIG. 1F, such as in a shallow trench isolation structure, or in sub-fin locations.

In another aspect, one or more embodiments of the present disclosure are directed to semiconductor structures or devices having one or more gate endcap structures (e.g., as gate isolation regions) of gate electrodes of the semiconductor structures or devices. Additionally, methods of fabricating gate endcap isolation structures in a self-aligned manner are also described. In one or more embodiments, self-aligned gate endcap structures are fabricated with gate-all-around features. Embodiments described herein may address issues associated with scaling diffusion end-to-end spacing in an ultra-scaled process technology.

Particular embodiments may be directed to CMOS integration of multiple width (multi-Wsi) nanowires and nanoribbons in a self-aligned gate endcap (SAGE) architecture. In an embodiment, NMOS and PMOS nanowires/nanoribbons are integrated with multiple Wsi in a SAGE architecture based front end process flow. Such a process flow may involve integration of nanowires and nanoribbons of different Wsi to provide robust functionality of next generation transistors with low power and high performance.

To provide context, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after. Advantages of a self-aligned gate endcap (SAGE) architecture over conventional approaches may include the enabling of higher layout density and, in particular, scaling of diffusion to diffusion spacing.

In accordance with an embodiment of the present disclosure, approaches are described which provide for self-aligned gate endcap and TCN overlap of a semiconductor nanowire without any need to allow for mask registration. In one such embodiment, a disposable spacer is fabricated on semiconductor fin sidewalls which determines the gate endcap and the contact overlap dimensions prior to releasing nanowires from the fin. The spacer defined endcap process enables the gate and TCN endcap regions to be self-aligned to the semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 2 illustrates cross-sectional views taken through nanowires for a conventional architecture (left-hand side (a)) versus a self-aligned gate endcap (SAGE) architecture (right-hand side (b)), in accordance with an embodiment of the present disclosure.

Figure 2:
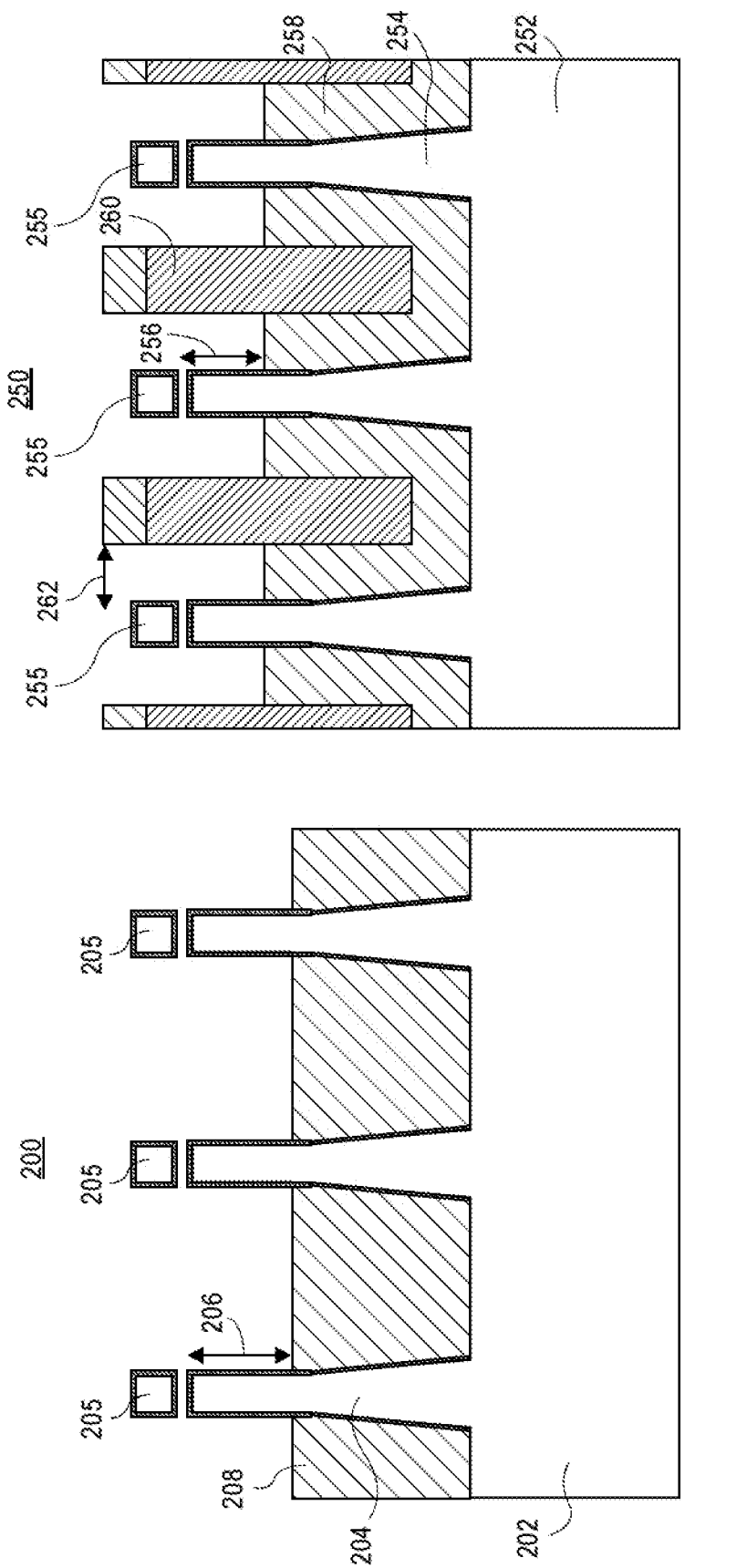
FIG. 2 illustrates cross-sectional views taken through nanowires for a conventional architecture (left-hand side) versus a self-aligned gate endcap (SAGE) architecture (right-hand side), in accordance with an embodiment of the present disclosure.

Referring to the left-hand side of FIG. 2, an integrated circuit structure 200 includes a substrate 202 having underlying fins 204 protruding therefrom by an amount 206 above an isolation structure 208 laterally surrounding lower portions of the fins 204. Corresponding nanowires 205 are over the fins 204. A gate structure may be formed over the integrated circuit structure 200 to fabricate a device. However, breaks in such a gate structure are accommodated for by increasing the spacing between fin 204/nanowire 205 pairs.

By contrast, referring to the right-hand side of FIG. 2, an integrated circuit structure 250 includes a substrate 252 having underlying fins 254 protruding therefrom by an amount 256 above an isolation structure 258 laterally surrounding lower portions of the fins 254. Corresponding nanowires 255 are over the fins 254. Isolating SAGE walls 260 (which may include a hardmask thereon, as depicted) are included within the isolation structure 258 and between adjacent fin 254/nanowire 255 pairs. The distance between an isolating SAGE wall 260 and a nearest fin 254/nanowire 255 pair defines the gate endcap spacing 262. A gate structure may be formed over the integrated circuit structure 250, between insolating SAGE walls to fabricate a device. Breaks in such a gate structure are imposed by the isolating SAGE walls 260. Since the isolating SAGE walls 260 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 260. In an embodiment, as depicted, the SAGE walls 260 each include a lower dielectric portion and a dielectric cap on the lower dielectric portion.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls. In an exemplary processing scheme, FIG. 3 illustrate cross-sectional views representing various operations in a method of fabricating a self-aligned gate endcap (SAGE) structure with gate-all-around devices of varying width, in accordance with an embodiment of the present disclosure.

Figure 3:
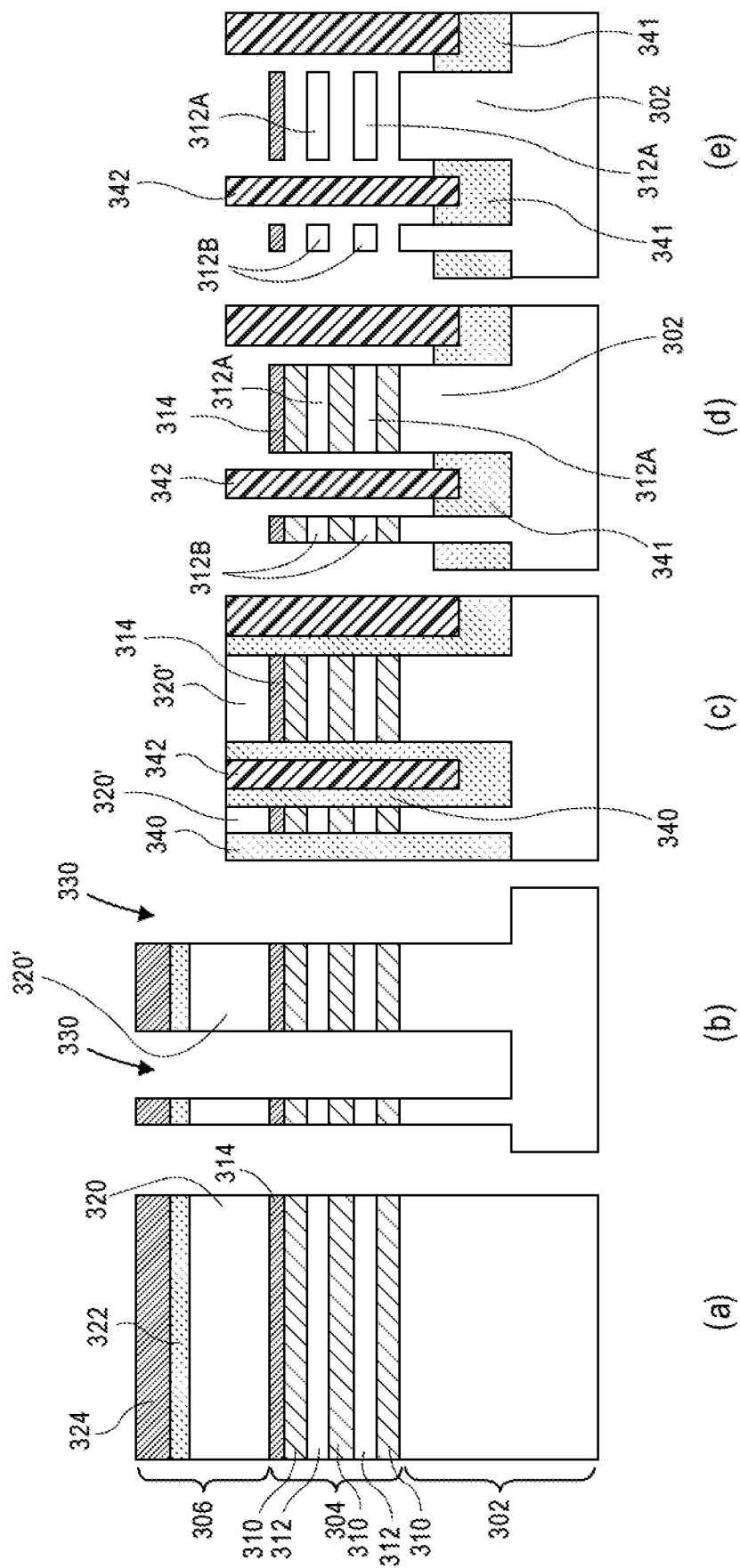
FIG. 3 illustrates cross-sectional views representing various operations in a method of fabricating a self-aligned gate endcap (SAGE) structure with gate-all-around devices of varying width, in accordance with an embodiment of the present disclosure.

Referring to part (a) of FIG. 3, a starting structure includes a nanowire patterning stack 304 above a substrate 302. A lithographic patterning stack 306 is formed above the nanowire patterning stack 304. The nanowire patterning stack 304 includes alternating silicon germanium layers 310 and silicon layers 312. A protective mask 314 is between the nanowire patterning stack 304 and the lithographic patterning stack 306. In one embodiment, the lithographic patterning stack 306 is trilayer mask composed of a topographic masking portion 320, an anti-reflective coating (ARC) layer 322, and a photoresist layer 324. In a particular such embodiment, the topographic masking portion 320 is a carbon hardmask (CHM) layer and the anti-reflective coating layer 322 is a silicon ARC layer.

Referring to part (b) of FIG. 3, the stack of part (a) is lithographically patterned and then etched to provide an etched structure including a patterned substrate 302 and trenches 330.

Referring to part (c) of FIG. 3, the structure of part (b) has an isolation layer 340 and a SAGE material 342 formed in trenches 330. The structure is then planarized to leave patterned topographic masking layer 320' as an exposed upper layer.

Referring to part (d) of FIG. 3, the isolation layer 340 is recessed below an upper surface of the patterned substrate 302, e.g., to define a protruding fin portion and to provide a trench isolation structure 341 beneath SAGE walls 342.

Referring to part (e) of FIG. 3, the silicon germanium layers 310 are removed at least in the channel region to release silicon nanowires 312A and 312B. Subsequent to the formation of the structure of part (e) of FIG. 3, gate stacks may be formed around nanowires 312B or 312A, over protruding fins of substrate 302, and between SAGE walls 342. In one embodiment, prior to formation of the gate stacks, the remaining portion of protective mask 314 is removed. In another embodiment, the remaining portion of protective mask 314 is retained as an insulating fin hat as an artifact of the processing scheme.

Referring again to part (e) of FIG. 3, in an embodiment, the channel region including nanowires 312B has a width less than the channel region including nanowires 312A. Thus, in an embodiment, an integrated circuit structure includes multiple width (multi-Wsi) nanowires. Although structures of 312B and 312A may be differentiated as nanowires and nanoribbons, respectively, both such structures are typically referred to herein as nanowires. It is also to be appreciated that reference to or depiction of a fin/ nanowire pair throughout may refer to a structure including a fin and one or more overlying nanowires (e.g., two overlying nanowires shown in FIG. 3).

Referring again to part (e) of FIG. 3, it is to be appreciated that a channel view is depicted, with source or drain regions being locating into and out of the page. In an embodiment, source or drain processing is subsequently performed according to a process scheme similar to or the same as the process scheme described above in association with FIGS. 1A-1F. In an embodiment, even though the channel region including nanowires 312B has a width less than the channel region including nanowires 312A, the extent of undercut for embedded epitaxial source or drain structure formation is the same or essentially the same for the corresponding source or drain structures associated with nanowires 312B and nanowires 312A, respectively.

To highlight an exemplary integrated circuit structure having three vertically arranged nanowires, FIG. 4A illustrates a three-dimensional cross-sectional view of a nanowire-based semiconductor structure, in accordance with an embodiment of the present disclosure. FIG. 4B illustrates a cross-sectional source or drain view of the nanowire-based semiconductor structure of FIG. 4A, as taken along the a-a' axis. FIG. 4C illustrates a cross-sectional channel view of the nanowire-based semiconductor structure of FIG. 4A, as taken along the b-b' axis.

Referring to FIG. 4A, a semiconductor device 400 includes one or more vertically stacked nanowires (404 set) above a substrate 402. An optional fin between the bottommost nanowire and the substrate 402 is not depicted for the sake of emphasizing the nanowire portion for illustrative purposes. Embodiments herein are targeted at both single wire devices and multiple wire devices. As an example, a three nanowire-based devices having nanowires 404A, 404B and 404C is shown for illustrative purposes. For convenience of description, nanowire 404A is used as an example where description is focused on one of the nanowires. It is to be appreciated that where attributes of one nanowire are described, embodiments based on a plurality of nanowires may have the same or essentially the same attributes for each of the nanowires.

Each of the nanowires 404 includes a channel region 406 in the nanowire. The channel region 406 has a length (L). Referring to FIG. 4C, the channel region also has a perimeter (Pc) orthogonal to the length (L). Referring to both FIGS. 4A and 4C, a gate electrode stack 408 surrounds the entire perimeter (Pc) of each of the channel regions 406. The gate electrode stack 408 includes a gate electrode along with a gate dielectric layer between the channel region 406 and the gate electrode (not shown). In an embodiment, the channel region 406 is discrete in that it is completely surrounded by the gate electrode stack 408 without any intervening material such as underlying substrate material or overlying channel fabrication materials. Accordingly, in embodiments having a plurality of nanowires 404, the channel regions 406 of the nanowires are also discrete relative to one another.

Referring to both FIGS. 4A and 4B, the semiconductor device 400 includes a pair of non-discrete source or drain regions 410/412. The pair of non-discrete source or drain regions 410/412 is on either side of the channel regions 406 of the plurality of vertically stacked nanowires 404. Furthermore, the pair of non-discrete source or drain regions 410/412 is adjoining (either directly or indirectly, the latter shown in FIG. 4A) for the channel regions 406 of the plurality of vertically stacked nanowires 404. In an embodiment, the source or drain regions 410/412 are non-discrete in that there are not individual and discrete source or drain regions for each channel region 406 of a nanowire 404. Accordingly, in embodiments having a plurality of nanowires 404, the source or drain regions 410/412 of the nanowires are global or unified source or drain regions as opposed to discrete for each nanowire. In one embodiment, from a cross-sectional perspective orthogonal to the length of the discrete channel regions 406, each of the pair of non-discrete source or drain regions 410/412 is approximately rectangular in shape, as depicted in FIG. 4B. In other embodiments, however, the source or drain regions 410/412 of the nanowires are relatively larger yet discrete non-merged epitaxial structures.

In accordance with an embodiment of the present disclosure, and as depicted in FIGS. 4A and 4B, the semiconductor device 400 further includes a pair of contacts 414, each contact 414 on one of the pair of non-discrete source or drain regions 410/412. In one such embodiment, as depicted in FIG. 4B, in a vertical sense, each contact 414 completely surrounds the respective non-discrete source or drain regions 410/412.

In another aspect, the entire perimeter of the non-discrete source or drain regions 410/412 may not be accessible for contact with contacts 414. Using FIG. 4B as a contrasting example, the entire perimeter of the non-discrete source or drain regions 410/412, as taken along the a-a' axis, is surrounded by the contacts 414. In another embodiment, however, access to the bottom of the non-discrete source or drain regions 410/412 is not made, e.g., due to the presence of an intervening dielectric layer, and the contact 414 thus only partially surrounds the non-discrete source or drain regions 410/412.

Referring to FIGS. 4B and 4C, the non-discrete source or drain regions 410/412 are global in the sense that a single unified feature is used as a source or drain region for a plurality (in this case, 3) of nanowires 404 and, more particularly, for more than one discrete channel region 406. In an embodiment, the pair of non-discrete source or drain regions 410/412 is composed of a semiconductor material different than the semiconductor material of the discrete channel regions 406, e.g., the pair of non-discrete source or drain regions 410/412 is composed of a silicon germanium while the discrete channel regions 406 are composed of silicon. In another embodiment, the pair of non-discrete source or drain regions 410/412 is composed of a semiconductor material the same or essentially the same as the semiconductor material of the discrete channel regions 406, e.g., both the pair of non-discrete source or drain regions 410/412 and the discrete channel regions 406 are composed of silicon.

Referring again to FIG. 4A, in an embodiment, the semiconductor device 400 further includes a pair of spacers 416. As is depicted, outer portions of the pair of spacers 416 may overlap portions of the non-discrete source or drain regions 410/412, providing for "embedded" portions of the non-discrete source or drain regions 410/412 beneath the pair of spacers 416. As is also depicted, the embedded" portions of the non-discrete source or drain regions 410/412 may not extend beneath the entirety of the pair of spacers 416.

Substrate 402 may be composed of a material suitable for semiconductor device fabrication. In one embodiment, substrate 402 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is on the lower bulk substrate. Thus, the structure 400 may be fabricated from a starting semiconductor-on-insulator substrate. Alternatively, the structure 400 is formed directly from a bulk substrate and local oxidation is used to form electrically insulative portions in place of the above described upper insulator layer. In another alternative embodiment, the structure 400 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 404 may be sized as wires or ribbons, as described below, and may have squared-off or rounder corners. In an embodiment, the nanowires 404 are composed of a material such as, but not limited to, silicon, germanium, or a combination thereof. In one such embodiment, the nanowires are single-crystalline. For example, for a silicon nanowire 404, a single-crystalline nanowire may be based from a (100) global orientation, e.g., with a <100> plane in the z-direction. As described below, other orientations may also be considered. In an embodiment, the dimensions of the nanowires 404, from a cross-sectional perspective, are on the nano-scale. For example, in a specific embodiment, the smallest dimension of the nanowires 404 is less than approximately 20 nanometers. In an embodiment, the nanowires 404 are composed of a strained material, particularly in the channel regions 406.

Referring to FIG. 4C, in an embodiment, each of the channel regions 406 has a width (Wc) and a height (Hc), the width (Wc) approximately the same as the height (Hc). That is, in both cases, the channel regions 406 are square-like or, if corner-rounded, circle-like in cross-section profile. In another aspect, the width and height of the channel region need not be the same. For example, in accordance with another embodiment of the present disclosure, FIG. 5A illustrates a cross-sectional source or drain view of another nanowire-based semiconductor structure. FIG. 5B illustrates a cross-sectional channel view of the nanowire-based semiconductor structure of FIG. 5A.

Referring to FIGS. 5A and 5B, in an embodiment, each of the channel regions 506 has a width (Wc) and a height (Hc). The width (Wc) is substantially greater than the height (Hc). For example, in a specific embodiment, the width Wc is approximately 2-10 times greater than the height Hc. That is, the channel regions 406 are rectangular-like or, if corner-rounded, oval-like in cross-section profile. Nanowires with such geometry may be referred to as horizontally oriented nanoribbons. In an alternative embodiment (not shown), the nanoribbons are oriented vertically. That is, each of the channel regions has a width and a height, the width substantially less than the height. In an embodiment, the source or drain regions 410/412 are non-discrete in that there are not individual and discrete source or drain regions for each channel region 406 of a nanowire 404. Accordingly, in embodiments having a plurality of nanowires 404, the source or drain regions 410/412 of the nanowires are global or unified source or drain regions, as is depicted in FIG. 5A, as opposed to discrete for each nanowire.

As described above, the channel regions are, in at least several embodiments, made to be discrete. However, not all regions of the nanowires need be, or even can be made to be discrete. For example, in an embodiment, a cross-sectional spacer view of a nanowire-based semiconductor structure includes portions of nanowires 404A-404C that are not discrete at a location under spacers 416. In one embodiment, the stack of nanowires 404A-404C have an intervening semiconductor material there between, such as silicon germanium intervening between silicon nanowires, or vice versa. For example, FIG. 6 illustrates a cross-sectional spacer view of a nanowire-based semiconductor structure, in accordance with an embodiment of the present disclosure.

Referring to FIG. 6, nanowires 404A-404C are not discrete at a location under spacers 416, e.g., at a location where non-discrete source or drain regions 410/412 do not extend beneath the pair of spacers 416. In one embodiment, the stack of nanowires 404A-404C have intervening semiconductor material 418 there between, such as silicon germanium intervening between silicon nanowires, or vice versa. In one embodiment, the bottom nanowire 404A is still in contact with a portion of substrate 402. Thus, in an embodiment, a portion of the plurality of vertically stacked nanowires under one or both of the spacers is non-discrete, either between nanowires, below the bottom nanowire 404A, or both.

In another aspect, methods of fabricating a nanowire portion of a nanowire-based semiconductor device are provided. For example, FIGS. 7A-7E illustrate three-dimensional cross-sectional views representing various operations in a method of fabricating a nanowire portion of a fin/nanowire structure, in accordance with an embodiment of the present disclosure.

Figure 7A:
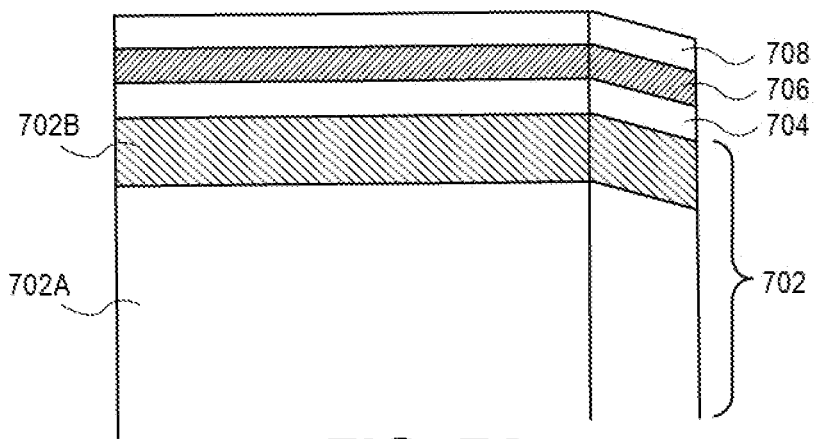
FIGS. 7A-7E illustrate three-dimensional cross-sectional views representing various operations in a method of fabricating a nanowire portion of a fin/nanowire structure, in accordance with an embodiment of the present disclosure.

A method of fabricating a nanowire semiconductor device may include forming a nanowire above a substrate. In a specific example showing the formation of two silicon nanowires, FIG. 7A illustrates a substrate 702 (e.g., composed of a bulk substrate silicon substrate 702A with an insulating silicon dioxide layer 702B there on) having a silicon layer 704/silicon germanium layer 706/silicon layer 708 stack thereon. It is to be appreciated that, in another embodiment, a silicon germanium layer/silicon layer/silicon germanium layer stack may be used to ultimately form two silicon germanium nanowires.

Figure 7B:
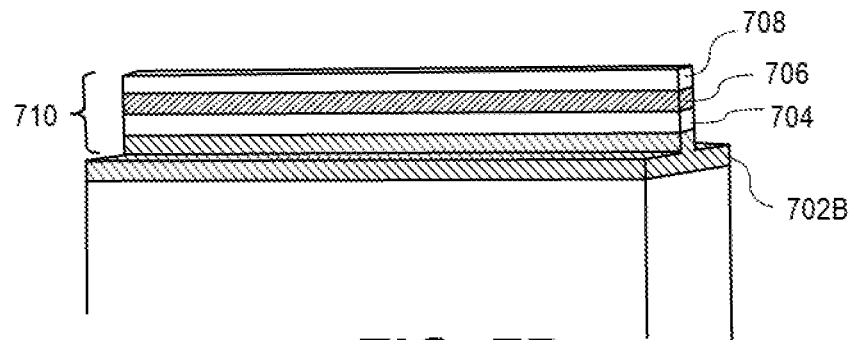

Referring to FIG. 7B, a portion of the silicon layer 704/silicon germanium layer 706/silicon layer 708 stack as well as a top portion of the silicon dioxide layer 702B is patterned into a fin-type structure 710, e.g., with a mask and plasma etch process. It is to be appreciated that, for illustrative purposes, the etch for FIG. 7B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 3.

Figure 7C:
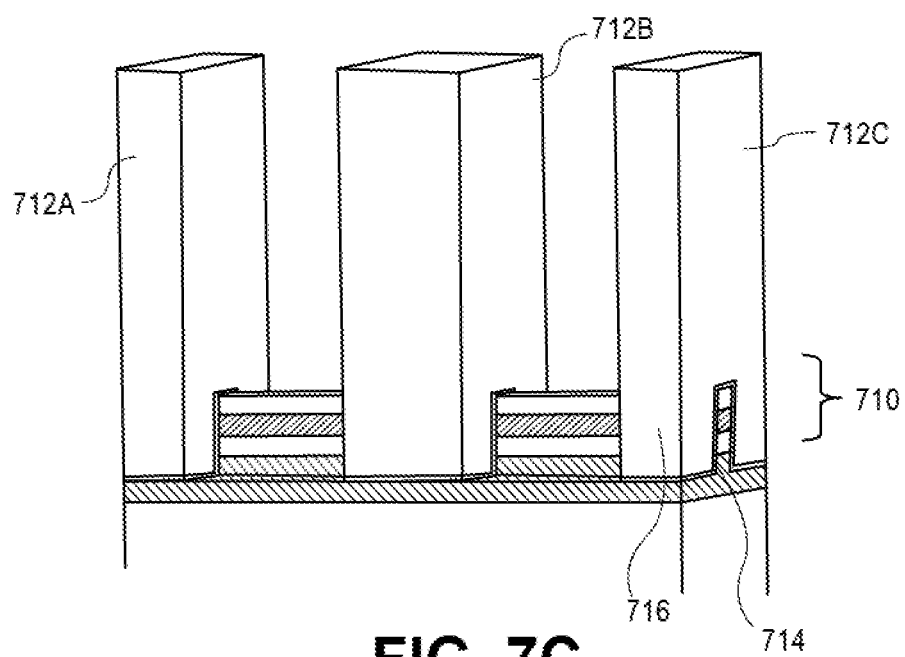

The method may also include forming a channel region in the nanowire, the channel region having a length and a perimeter orthogonal to the length. In a specific example showing the formation of three gate structures over the two silicon nanowires, FIG. 7C illustrates the fin-type structure 710 with three sacrificial gates 712A, 712B, and 712C thereon. In one such embodiment, the three sacrificial gates 712A, 712B, and 712C are composed of a sacrificial gate oxide layer 714 and a sacrificial polysilicon gate layer 716 which are blanket deposited and patterned with a plasma etch process.

Figure 7D:
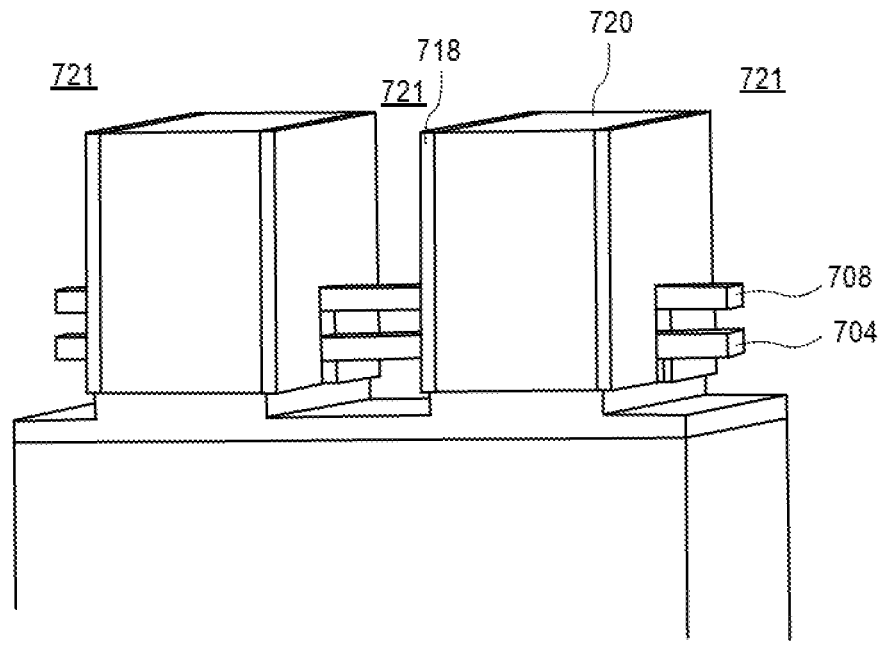

Following patterning to form the three sacrificial gates 712A, 712B, and 712C, spacers may be formed on the sidewalls of the three sacrificial gates 712A, 712B, and 712C, and an interlayer dielectric layer may be formed to cover the three sacrificial gates 712A, 712B, and 712C. The interlayer dielectric layer may be polished to expose the three sacrificial gates 712A, 712B, and 712C for a replacement gate, or gate-last, process. Referring to FIG. 7D, the three sacrificial gates 712A, 712B, and 712C have been removed, leaving spacers 718 and a portion of the interlayer dielectric layer 720 remaining.

Additionally, referring again to FIG. 7D the portions of the silicon germanium layer 706 and the portion of the insulating silicon dioxide layer 702B of the fin structure 710 are removed in the regions originally covered by the three sacrificial gates 712A, 712B, and 712C. Discrete portions of the silicon layers 704 and 708 thus remain, as depicted in FIG. 7D.

The discrete portions of the silicon layers 704 and 708 shown in FIG. 7D will, in one embodiment, ultimately become channel regions in a nanowire-based device. Thus, at the process stage depicted in FIG. 7D, channel engineering or tuning may be performed. For example, in one embodiment, the discrete portions of the silicon layers 704 and 708 shown in FIG. 7D are thinned using oxidation and etch processes. Such an etch process may be performed at the same time the wires are separated by etching the silicon germanium layer 706. Accordingly, the initial wires formed from silicon layers 704 and 708 begin thicker and are thinned to a size suitable for a channel region in a nanowire device, independent from the sizing of the source or drain regions of the device. Thus, in an embodiment, forming the channel region includes removing a portion of the nanowire, and the resulting perimeters of the source or drain regions (described below) are greater than the perimeter of the resulting channel region.

Figure 7E:
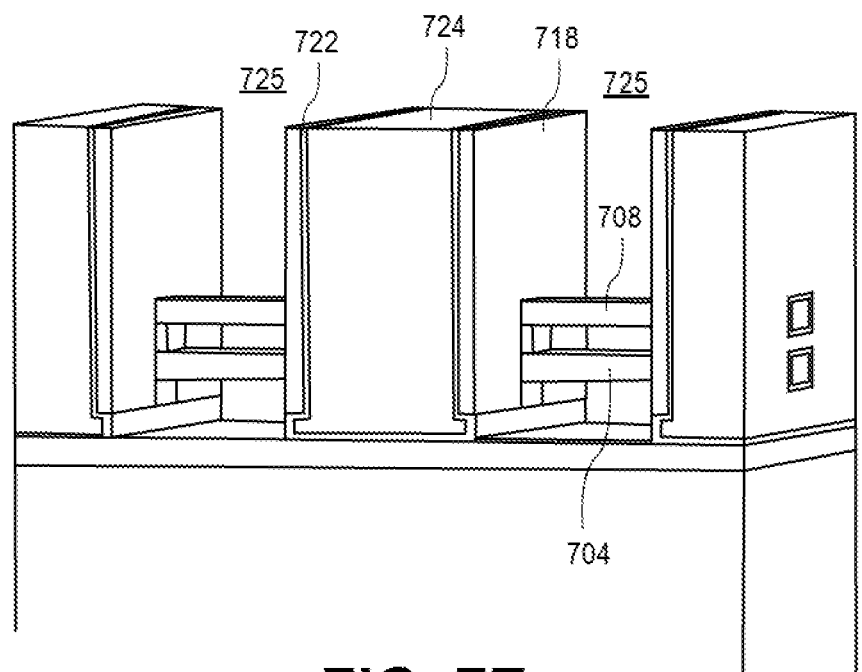

The method may also include forming a gate electrode stack surrounding the entire perimeter of the channel region. In the specific example showing the formation of three gate structures over the two silicon nanowires, FIG. 7E illustrates the structure following deposition of a gate dielectric layer 722 (such as a high-k gate dielectric layer) and a gate electrode layer 724 (such as a metal gate electrode layer), and subsequent polishing, in between the spacers 718. That is, gate structures are formed in the trenches 721 of FIG. 7D. Additionally, FIG. 7E depicts the result of the subsequent removal of the interlayer dielectric layer 720 after formation of the permanent gate stack. The portions of the silicon germanium layer 706 and the portion of the insulating silicon dioxide layer 702B of the fin structure 710 are also removed in the regions originally covered by the portion of the interlayer dielectric layer 720 depicted in FIG. 7D. Discrete portions of the silicon layers 704 and 708 thus remain in source or drain locations, as depicted in FIG. 7E.

The method may also include implanting impurity atoms in the exposed portions of the nanowires 704/708 in the source or drain locations. Specifically, the discrete portions of the silicon layers 704 and 708 shown in FIG. 7E will, in one embodiment, ultimately be recessed to form epi undercut locations for eventual embedded epitaxial source or drain formation. In an embodiment, a pair of non-discrete source or drain regions for the nanowires is fabricated on either side of the channel regions. In an example, FIG. 8 illustrates a three-dimensional cross-sectional view of a nanowire semiconductor device with non-discrete source or drain regions, in accordance with an embodiment of the present disclosure.

Figure 8:
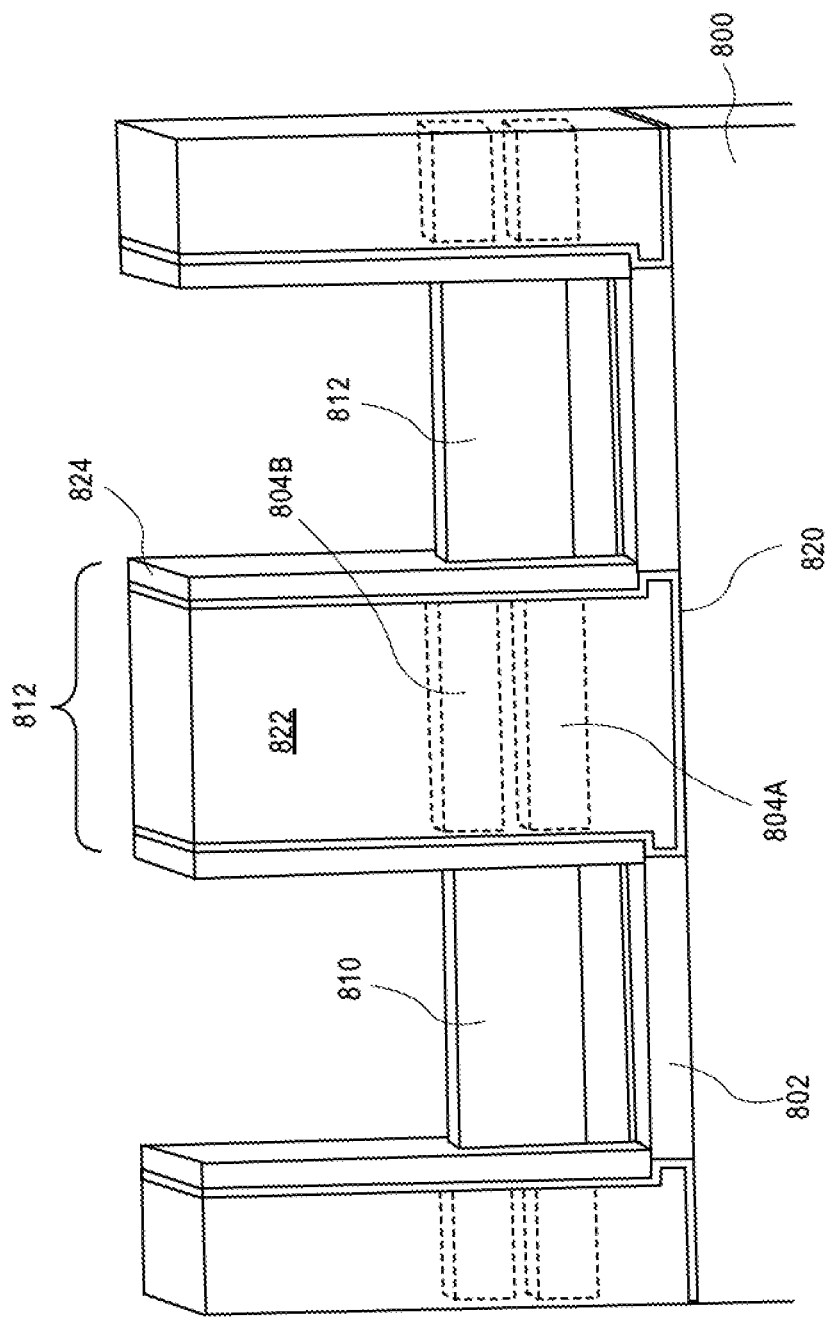
FIG. 8 illustrates a three-dimensional cross-sectional view of a nanowire semiconductor device with non-discrete source or drain regions, in accordance with an embodiment of the present disclosure.

Referring to FIG. 8, a gate electrode stack 812 includes a gate dielectric layer 820, a gate electrode 822 and sidewall spacers 824. The gate electrode stack 812 surrounds discrete nanowire channel regions 804A/B. A pair of non-discrete source or drain regions 810 and 812 adjoin the discrete channel regions 804A/B. A buried oxide layer 802 isolates a substrate 800. It is to be appreciated that the concepts herein are applicable to wires both on bulk or on under fin oxide structures, such as an underlying omega-FET device.

It is also to be appreciated that conductive contacts may subsequently be formed around the non-discrete source or drain regions 810 and 812.

In another aspect, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage/dual endcap process is used for fabrication of an ultra-scaled finfet transistor architecture. In an embodiment, channel widths of the nanowires differ between the standard logic and the high voltage (HVI/O) devices. For example, in an embodiment, the high voltage (HVI/O) devices have relatively wider nanowires (e.g., nanoribbons) than the nanowires of the standard logic devices.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitation imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture prior to a fin cut process. The logic transistor endcap is ultra-scaled by using the self-aligned endcap architecture, while the high-voltage transistor has a wider endcap to accommodate a thicker gate dielectric. In an embodiment, both endcaps are unidirectional endcaps in that they are formed prior to fin cut processing.

One or more embodiments described herein are directed to, or may be referred to as, a dual unidirectional endcap process flow for ultra-scaled logic endcap. To provide context, in a typical SAGE flow, a single endcap spacer is deposited to form a self-aligned endcap separating a fin from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness.

Figure 9A:
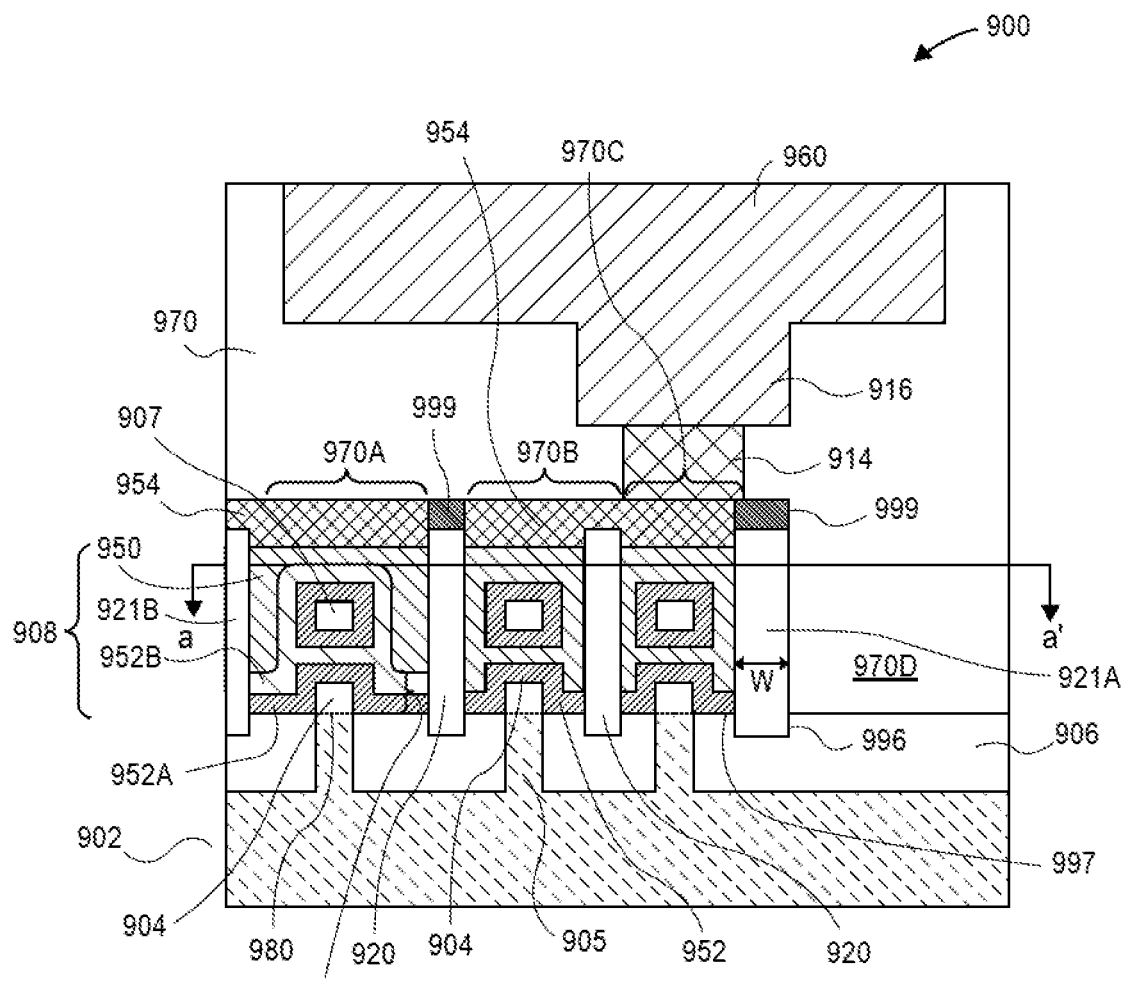
FIG. 9A illustrates a cross-sectional view of a nanowire-based integrated circuit structure having self-aligned gate endcap isolation, in accordance with an embodiment of the present disclosure.
Figure 9B:
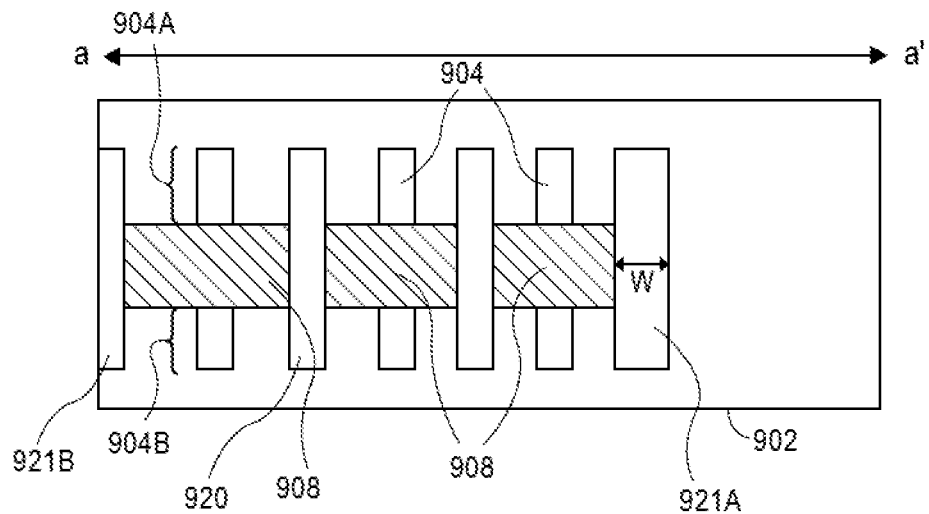
FIG. 9B illustrates a plan view taken along the a-a' axis of the semiconductor devices of FIG. 9A, in accordance with an embodiment of the present disclosure.

As an example of such devices, FIG. 9A illustrates a cross-sectional view of a nanowire-based integrated circuit structure having self-aligned gate endcap isolation, in accordance with an embodiment of the present disclosure. FIG. 9B illustrates a plan view taken along the a-a' axis of the semiconductor devices of FIG. 9A, in accordance with an embodiment of the present disclosure.

Referring to FIG. 9A, a semiconductor structure 900 includes non-planar active regions, e.g., a protruding fin portion 904 and one or more vertically overlying nanowires 907. The protruding fin portions 904 may be included in fin structures which further include a sub-fin region 905 formed from substrate 902, and within a trench isolation layer 906. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach. Each of the individual fins 904 depicted may represent corresponding individual fins, or may represent a plurality of fins at a given location.

Gate structures 908 are over the protruding portions 904 of the non-planar active regions and around the one or more corresponding vertically overlying nanowires 907, as well as over a portion of the trench isolation layer 906. As shown, gate structures 908 include a gate electrode 950 and a gate dielectric layer 952. In one embodiment, although not shown, gate structures 908 may also include a dielectric cap layer.

Gate structures 908 are separated by narrow self-aligned gate endcap (SAGE) isolation structures or walls 920, 921A or 921B. The SAGE walls 920 each have a width. In an embodiment, the SAGE wall 921A has a width greater than the width of each of the SAGE walls 920, and the SAGE wall 921B has a width less than the width of each of the SAGE walls 920. SAGE walls of differing width may be associated with different device types, as described in an exemplary embodiment below. Each SAGE wall 920, 921A or 921B may include one or more of a local interconnect 954 or a dielectric plug 999 formed thereon. In an embodiment, each of the SAGE walls 920, 921A or 921B is recessed below an uppermost surface 997 of the trench isolation layer 906, as is depicted in FIG. 9A.

Accordingly, it is to be appreciated that, as exemplified, SAGE walls of varying width may be fabricated. It is also to be appreciated that fabrication of gate endcap isolation structures may lead to formation of a vertical seam within the gate endcap isolation structures. It is also to be appreciated that a stack of dielectric layers may be used to form a SAGE wall. It is also to be appreciated that gate endcap isolation structures may differ in composition depending on the spacing of adjacent fins.

In an exemplary embodiment, the semiconductor structure 900 includes a first plurality of semiconductor fin/nanowire pairs (fin/nanowire pair(s) 904/907 of region 970A) above a substrate 902 and protruding through an uppermost surface 997 of a trench isolation layer 906, and a first gate structure (gate structure 908 of region 970A) over the first plurality of semiconductor fin/nanowire pairs. A second plurality of semiconductor fin/nanowire pairs (fin/nanowire pair(s) 904/907 of region 970B) is above the substrate 902 and protrudes through the uppermost surface 997 of the trench isolation layer 906, and a second gate structure (gate structure 908 of region 970B) is over the second plurality of semiconductor fin/nanowire pairs. A gate endcap isolation structure (left-hand SAGE wall 920) is between and in contact with the first gate structure and the second gate structure. A semiconductor fin/nanowire pair of the first plurality of semiconductor fins closest to the gate endcap isolation structure (from region 970A) is spaced farther from the gate endcap isolation structure than a semiconductor fin/nanowire pair of the second plurality of semiconductor fins closest to the gate endcap isolation structure (from region 970B).

In an embodiment, region 970A is an I/O region, and region 970B is a logic region. As depicted, in one such embodiment, a second logic region 970C is adjacent the logic region 970B, and is electrically connected to the logic region 970B by a local interconnect 954. Another region 970D may be a location where an addition logic or I/O region may be placed. Embodiments described herein may involve differential spacing from a SAGE wall (e.g., a wider spacing from SAGE walls 921B and left-hand 920 in region 970A), or may involve SAGE walls of differing width (e.g., narrower 921B versus 920 versus wider 921A), or both differential spacing from a SAGE wall and SAGE walls of differing width. In an embodiment, I/O regions have a greater spacing between SAGE walls than a logic region. In an embodiment, a wider SAGE wall is between adjacent logic regions than is between adjacent I/O regions.

In an embodiment, although not depicted in FIGS. 9A and 9B, channel widths of the nanowires differ between the standard logic and the high voltage (HVI/O) devices. For example, in an embodiment, the high voltage (HVI/O) devices have relatively wider nanowires (e.g., nanoribbons) than the nanowires of the standard logic devices. In an alternative embodiment, the high voltage (HVI/O) devices have relatively narrower nanowires (e.g., nanoribbons) than the nanowires of the standard logic devices.

A gate contact 914, and overlying gate contact via 916 are also seen from this perspective, along with an overlying metal interconnect 960, all of which are in interlayer dielectric stacks or layers 970. Also seen from the perspective of FIG. 9A, the gate contact 914 is, in one embodiment, over the non-planar active regions. As is also depicted in FIG. 9A, an interface 980 exists between a doping profile of protruding fin portions 904 and sub-fin regions 905, although other embodiments do not include such an interface in doping profile between these regions.

Referring to FIGS. 9A and 9B, the gate structures 908 are shown as over the protruding fin portions 904 and corresponding nanowires 907, as isolated by self-aligned gate endcap isolation structures 920. In an embodiment, the gate structures 908 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 9B, source or drain regions 904A and 904B of the protruding fin portions 904 and corresponding nanowire(s) 907 are shown in this perspective, although it is to be appreciated that these regions would be overlapped with trench contact structures. In an embodiment, the material of the protruding fin/nanowire portions 904/907 is removed and replaced with another semiconductor material, e.g., by epitaxial deposition. In one such embodiment, the source or drain regions 904A and 904B are formed using an undercut processing scheme such as the processing scheme described above in association with FIGS. 1A-1F.

In an embodiment, the semiconductor structure 900 includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures 908 surround at least a top surface and a pair of sidewalls of the three-dimensional body, and further surrounds each of the one or more discrete nanowire channel portions.

Substrate 902 may be composed of a semiconductor material that can withstand a manufacturing process and in which charge can migrate. In an embodiment, substrate 902 is a bulk substrate composed of a crystalline silicon, silicon/germanium or germanium layer doped with a charge carrier, such as but not limited to phosphorus, arsenic, boron or a combination thereof, to form active region 904. In one embodiment, the concentration of silicon atoms in bulk substrate 902 is greater than 97%. In another embodiment, bulk substrate 902 is composed of an epitaxial layer grown atop a distinct crystalline substrate, e.g. a silicon epitaxial layer grown atop a boron-doped bulk silicon mono-crystalline substrate. Bulk substrate 902 may alternatively be composed of a group III-V material. In an embodiment, bulk substrate 902 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 902 is composed of a III-V material and the charge-carrier dopant impurity atoms are ones such as, but not limited to, carbon, silicon, germanium, oxygen, sulfur, selenium or tellurium.

Trench isolation layer 906 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 906 is composed of a dielectric material such as, but not limited to, silicon dioxide, silicon oxy-nitride, silicon nitride, or carbon-doped silicon nitride.

Self-aligned gate endcap isolation structures 920, 921A and 921B may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 908 may be composed of a gate electrode stack which includes a gate dielectric layer 952 and a gate electrode layer 950. In an embodiment, the gate electrode of the gate electrode stack is composed of a metal gate and the gate dielectric layer includes a high-K material.

In an exemplary embodiment, the gate structure 908 of region 970A includes a first gate dielectric 952 conformal with the first plurality of semiconductor fin/nanowire pairs and laterally adjacent to and in contact with a first side of the gate endcap isolation structure (left-hand 920). The second gate stack of region 970B includes a second gate dielectric 952 conformal with the second plurality of semiconductor fin/nanowire pairs and laterally adjacent to and in contact with a second side of the gate endcap isolation structure opposite the first side of the gate endcap isolation structure. In one embodiment, the first gate dielectric is thicker than the second gate dielectric, as is depicted in FIG. 9A. In one embodiment, the first gate dielectric has more dielectric layers (e.g., layers 952A and 952B) than the second gate dielectric (e.g., only layer 952). In an embodiment, the gate dielectric of region 970A is an I/O gate dielectric, and the gate dielectric of region 970B is a logic gate dielectric.

In an embodiment, the gate dielectric of region 970B is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 902. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 970A includes a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 952A) is formed below a layer of high-k material (e.g., layer 952B).

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 954, gate contact 914, overlying gate contact via 916, and overlying metal interconnect 960 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 900 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 908 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 900. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 9A, in an embodiment, as depicted, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
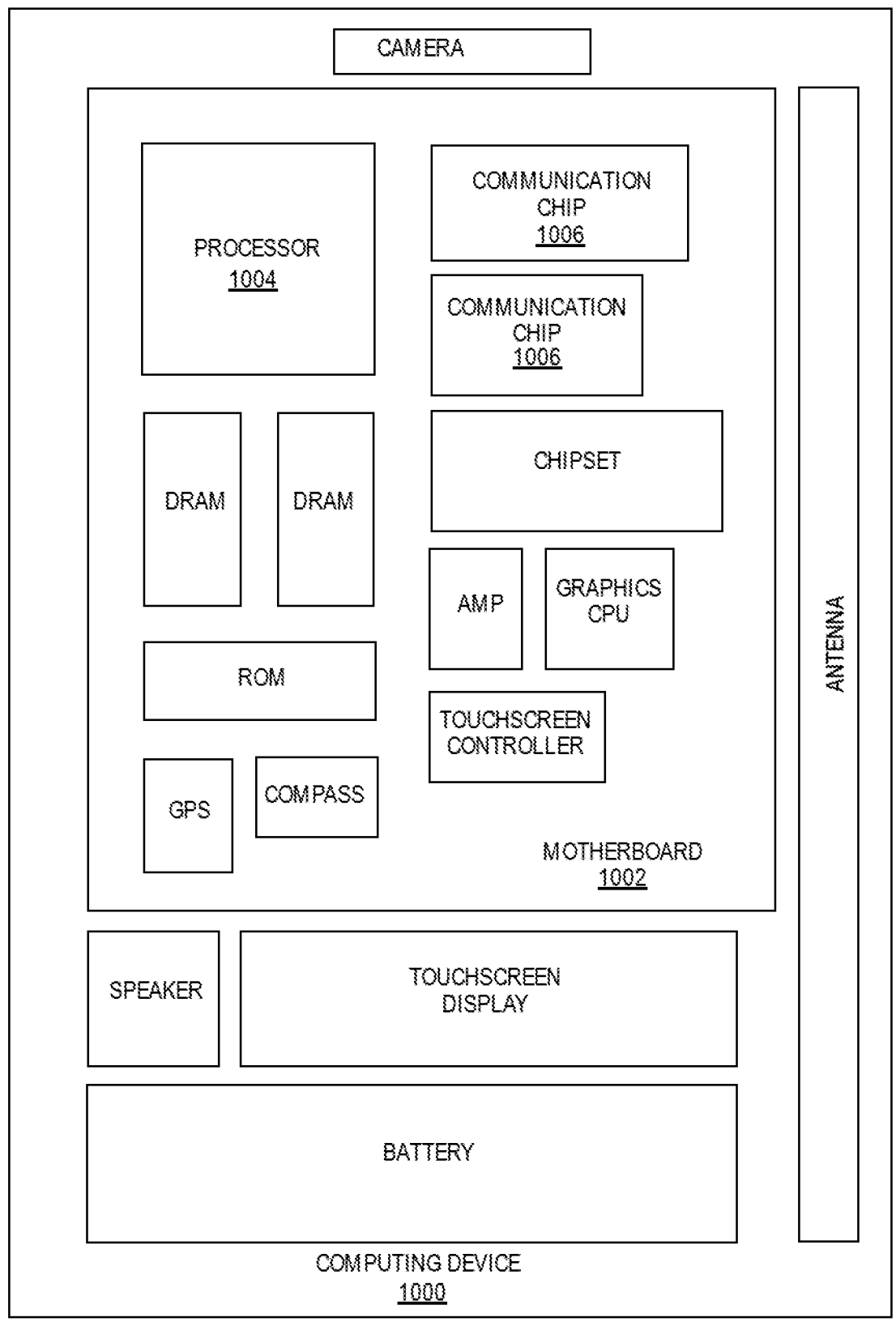
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as gate-all-around integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as gate-all-around integrated circuit structures built in accordance with implementations of embodiments of the present disclosure.

In further implementations, another component housed within the computing device 1000 may contain an integrated circuit die that includes one or structures, such as gate-all-around integrated circuit structures built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
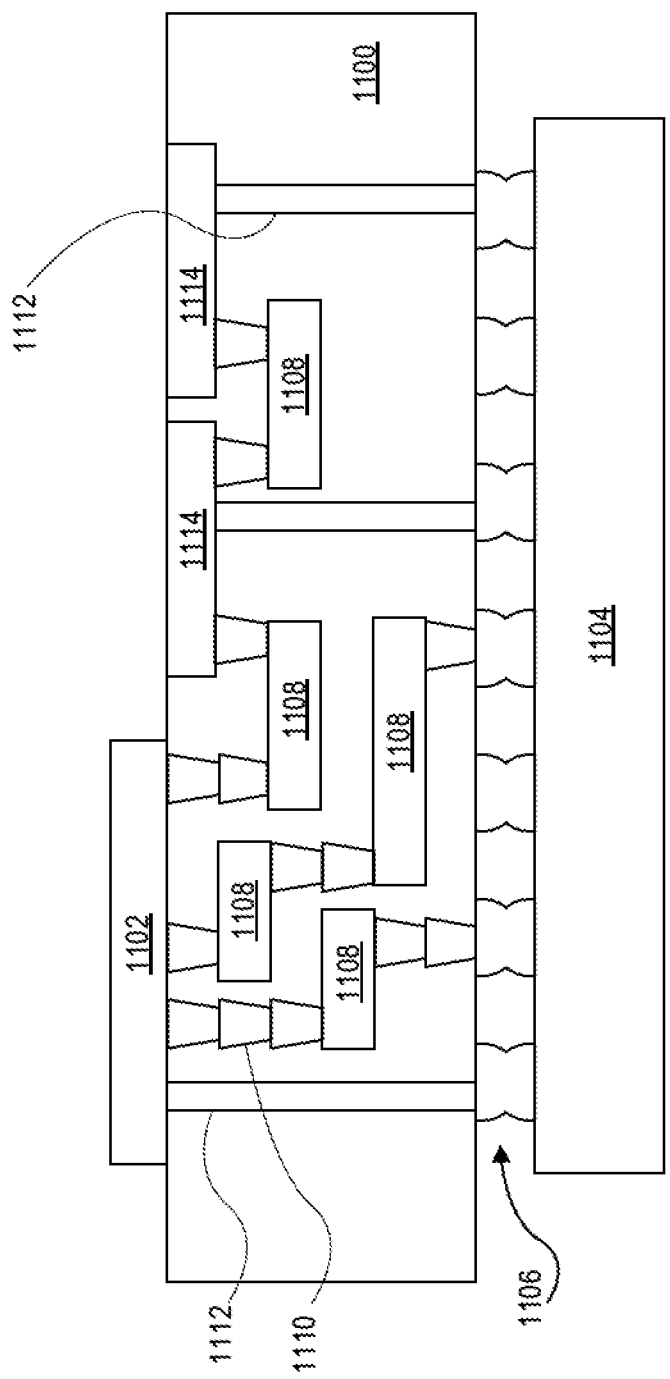
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include gate-all-around integrated circuit structures having self-aligned source or drain undercut for varied widths, and methods of fabricating gate-all-around integrated circuit structures having self-aligned source or drain undercut for varied widths.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires. A first gate stack portion is over the first vertical arrangement of nanowires, the first gate stack portion having dielectric sidewalls spacers. A second gate stack portion is over the second vertical arrangement of nanowires, the second gate stack portion having dielectric sidewalls spacers. First embedded epitaxial source or drain regions are at ends of the first vertical arrangement of nanowires, the first embedded epitaxial source or drain regions extending beneath the dielectric sidewalls spacers of the first gate stack portion by a first distance. Second embedded epitaxial source or drain regions are at ends of the second vertical arrangement of nanowires, the second embedded epitaxial source or drain regions extending beneath the dielectric sidewalls spacers of the second gate stack portion by a second distance substantially the same as the first distance.

Example Embodiment 2

The integrated circuit structure of example embodiment 1, wherein the first gate stack portion and the second gate stack portion are included in a same gate stack.

Example Embodiment 3

The integrated circuit structure of example embodiment 1, wherein the first gate stack portion and the second gate stack portion are included in a first gate stack and a second gate stack, respectively, the first gate stack and the second gate stack isolated from one another.

Example Embodiment 4

The integrated circuit structure of example embodiment 1, 2 or 3, wherein the first and second embedded epitaxial source or drain regions are non-discrete first and second embedded epitaxial source or drain regions.

Example Embodiment 5

The integrated circuit structure of example embodiment 1, 2 or 3, wherein the first and second embedded epitaxial source or drain regions are discrete first and second embedded epitaxial source or drain regions.

Example Embodiment 6

The integrated circuit structure of example embodiment 1, 2, 3, 4 or 5, wherein the first vertical arrangement of nanowires is over a first fin, and the second vertical arrangement of nanowires is over a second fin.

Example Embodiment 7

The integrated circuit structure of example embodiment 1, 2, 3, 4, 5 or 6, wherein the first and second gate stack portions each include a high-k gate dielectric layer and a metal gate electrode.

Example Embodiment 8

A method of fabricating an integrated circuit structure includes forming a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires. A first gate stack portion is formed over the first vertical arrangement of nanowires and a second gate stack portion is formed over the second vertical arrangement of nanowires. First dielectric sidewall spacers are formed along the first and second gate stack portions. Impurity atoms are implanted into portions of the first vertical arrangement of nanowires and the second vertical arrangement of nanowires that are not covered by the first dielectric sidewall spacers. Second dielectric sidewall spacers are formed along the first and second gate stack portions. The portions of the first vertical arrangement of nanowires and the second vertical arrangement of nanowires implanted with the impurity atoms are removed to form recessed ends of the first and second vertical arrangements of nanowires. First embedded epitaxial source or drain regions are formed at the recessed ends of the first vertical arrangement of nanowires, the first embedded epitaxial source or drain regions extending beneath the second dielectric sidewalls spacers by a first distance. Second embedded epitaxial source or drain regions are formed at the recessed ends of the second vertical arrangement of nanowires, the second embedded epitaxial source or drain regions extending beneath the second dielectric sidewalls spacers by a second distance substantially the same as the first distance.

Example Embodiment 9

The method of example embodiment 8, wherein the first dielectric sidewall spacers are removed prior to forming the second dielectric sidewall spacers.

Example Embodiment 10

The method of example embodiment 8, wherein the first dielectric sidewall spacers are not removed prior to forming the second dielectric sidewall spacers.

Example Embodiment 11

The method of example embodiment 8, 9 or 10, wherein the first gate stack portion and the second gate stack portion are included in a same gate stack.

Example Embodiment 12

The method of example embodiment 8, 9 or 10, wherein the first gate stack portion and the second gate stack portion are included in a first gate stack and a second gate stack, respectively, the first gate stack and the second gate stack isolated from one another.

Example Embodiment 13

The method of example embodiment 8, 9, 10, 11 or 12, wherein the first and second embedded epitaxial source or drain regions are non-discrete first and second embedded epitaxial source or drain regions.

Example Embodiment 14

The method of example embodiment 8, 9, 10, 11 or 12, wherein the first and second embedded epitaxial source or drain regions are discrete first and second embedded epitaxial source or drain regions.

Example Embodiment 15

The method of example embodiment 8, 9, 10, 11, 12, 13 or 14, wherein the first vertical arrangement of nanowires is over a first fin, and the second vertical arrangement of nanowires is over a second fin.

Example Embodiment 16

The method of example embodiment 8, 9, 10, 11, 12, 13, 14 or 15, wherein the first and second gate stack portions are subsequently replaced with permanent first and second gate stack portions including a high-k gate dielectric layer and a metal gate electrode.

Example Embodiment 17

An integrated circuit structure includes a first fin having a longest dimension along a first direction. A first nanowire is over the first fin. A second fin having a longest dimension is along the first direction. A second nanowire is over the second fin. The second nanowire is wider than the nanowire. A first gate structure is over the first nanowire and the first fin, the first gate structure having a longest dimension along a second direction, the second direction orthogonal to the first direction. A second gate structure is over the second nanowire and over the second fin, the second gate structure having a longest dimension along the second direction, the second gate structure discontinuous with the first gate structure along the second direction, and the second gate structure having an edge facing an edge of the first gate structure along the second direction. A gate endcap isolation structure is between and in contact with the edge of the first gate structure and the edge of the second gate structure along the second direction, the gate endcap isolation structure having a length along the first direction greater than a length of the first gate structure and the second gate structure along the first direction. First dielectric sidewall spacers are along the first gate structure. Second dielectric sidewall spacers are along the second gate structure. First embedded epitaxial source or drain regions are at ends of the first nanowire, the first embedded epitaxial source or drain regions extending beneath the first dielectric sidewalls spacers by a first distance. Second embedded epitaxial source or drain regions are at ends of the second nanowire, the second embedded epitaxial source or drain regions extending beneath the second dielectric sidewalls spacers by a second distance substantially the same as the first distance.

Example Embodiment 18

The integrated circuit structure of example embodiment 17, wherein the first and second embedded epitaxial source or drain regions are non-discrete first and second embedded epitaxial source or drain regions.

Example Embodiment 19

The integrated circuit structure of example embodiment 17, wherein the first and second embedded epitaxial source or drain regions are discrete first and second embedded epitaxial source or drain regions.

Example Embodiment 20

The integrated circuit structure of example embodiment 17, 18 or 19, wherein the gate endcap isolation structure has a height greater than a height of the first gate structure and greater than a height of the second gate structure.

Example Embodiment 21

The integrated circuit structure of example embodiment 20, further including a local interconnect over a portion of the first gate structure, over a portion of the gate endcap isolation structure, and over a portion of the second gate structure.

What is claimed is:
1. An integrated circuit structure, comprising:
   a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires;
   a first gate stack portion over the first vertical arrangement of nanowires, the first gate stack portion having dielectric sidewalls spacers;
   a second gate stack portion over the second vertical arrangement of nanowires, the second gate stack portion having dielectric sidewalls spacers;

first embedded epitaxial source or drain regions at ends of the first vertical arrangement of nanowires, the first embedded epitaxial source or drain regions extending beneath the dielectric sidewalls spacers of the first gate stack portion by a first distance; and second embedded epitaxial source or drain regions at ends of the second vertical arrangement of nanowires, the second embedded epitaxial source or drain regions extending beneath the dielectric sidewalls spacers of the second gate stack portion by a second distance substantially the same as the first distance.

2. The integrated circuit structure of claim 1, wherein the first gate stack portion and the second gate stack portion are included in a same gate stack.

3. The integrated circuit structure of claim 1, wherein the first gate stack portion and the second gate stack portion are included in a first gate stack and a second gate stack, respectively, the first gate stack and the second gate stack isolated from one another.

4. The integrated circuit structure of claim 1, wherein the first and second embedded epitaxial source or drain regions are non-discrete first and second embedded epitaxial source or drain regions.

5. The integrated circuit structure of claim 1, wherein the first and second embedded epitaxial source or drain regions are discrete first and second embedded epitaxial source or drain regions.

6. The integrated circuit structure of claim 1, wherein the first vertical arrangement of nanowires is over a first fin, and the second vertical arrangement of nanowires is over a second fin.

7. The integrated circuit structure of claim 1, wherein the first and second gate stack portions each comprise a high-k gate dielectric layer and a metal gate electrode.

8. A method of fabricating an integrated circuit structure, the method comprising:

forming a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires;

forming a first gate stack portion over the first vertical arrangement of nanowires and a second gate stack portion over the second vertical arrangement of nanowires;

forming first dielectric sidewall spacers along the first and second gate stack portions;

implanting impurity atoms into portions of the first vertical arrangement of nanowires and the second vertical arrangement of nanowires that are not covered by the first dielectric sidewall spacers;

forming second dielectric sidewall spacers along the first and second gate stack portions;

removing the portions of the first vertical arrangement of nanowires and the second vertical arrangement of nanowires implanted with the impurity atoms to form recessed ends of the first and second vertical arrangements of nanowires;

forming first embedded epitaxial source or drain regions at the recessed ends of the first vertical arrangement of nanowires, the first embedded epitaxial source or drain regions extending beneath the second dielectric sidewalls spacers by a first distance; and forming second embedded epitaxial source or drain regions at the recessed ends of the second vertical arrangement of nanowires, the second embedded epitaxial source or drain regions extending beneath the second dielectric sidewalls spacers by a second distance substantially the same as the first distance.

9. The method of claim 8, wherein the first dielectric sidewall spacers are removed prior to forming the second dielectric sidewall spacers.

10. The method of claim 8, wherein the first dielectric sidewall spacers are not removed prior to forming the second dielectric sidewall spacers.

11. The method of claim 8, wherein the first gate stack portion and the second gate stack portion are included in a same gate stack.

12. The method of claim 8, wherein the first gate stack portion and the second gate stack portion are included in a first gate stack and a second gate stack, respectively, the first gate stack and the second gate stack isolated from one another.

13. The method of claim 8, wherein the first and second embedded epitaxial source or drain regions are non-discrete first and second embedded epitaxial source or drain regions.

14. The method of claim 8, wherein the first and second embedded epitaxial source or drain regions are discrete first and second embedded epitaxial source or drain regions.

15. The method of claim 8, wherein the first vertical arrangement of nanowires is over a first fin, and the second vertical arrangement of nanowires is over a second fin.

16. The method of claim 8, wherein the first and second gate stack portions are subsequently replaced with permanent first and second gate stack portions comprising a high-k gate dielectric layer and a metal gate electrode.

17. An integrated circuit structure, comprising:

a first fin having a longest dimension along a first direction;

a first nanowire over the first fin;

a second fin having a longest dimension along the first direction;

a second nanowire over the second fin, wherein the second nanowire is wider than the nanowire;

a first gate structure over the first nanowire and the first fin, the first gate structure having a longest dimension along a second direction, the second direction orthogonal to the first direction;

a second gate structure over the second nanowire and over the second fin, the second gate structure having a longest dimension along the second direction, the second gate structure discontinuous with the first gate structure along the second direction, and the second gate structure having an edge facing an edge of the first gate structure along the second direction;

a gate endcap isolation structure between and in contact with the edge of the first gate structure and the edge of the second gate structure along the second direction, the gate endcap isolation structure having a length along the first direction greater than a length of the first gate structure and the second gate structure along the first direction;

first dielectric sidewall spacers along the first gate structure;

second dielectric sidewall spacers along the second gate structure;

first embedded epitaxial source or drain regions at ends of the first nanowire, the first embedded epitaxial source or drain regions extending beneath the first dielectric sidewalls spacers by a first distance; and second embedded epitaxial source or drain regions at ends of the second nanowire, the second embedded epitaxial source or drain regions extending beneath the second dielectric sidewalls spacers by a second distance substantially the same as the first distance.

18. The integrated circuit structure of claim 17, wherein the first and second embedded epitaxial source or drain regions are non-discrete first and second embedded epitaxial source or drain regions.

19. The integrated circuit structure of claim 17, wherein the first and second embedded epitaxial source or drain regions are discrete first and second embedded epitaxial source or drain regions.

20. The integrated circuit structure of claim 17, wherein the gate endcap isolation structure has a height greater than a height of the first gate structure and greater than a height of the second gate structure.

21. The integrated circuit structure of claim 20, further comprising:

a local interconnect over a portion of the first gate structure, over a portion of the gate endcap isolation structure, and over a portion of the second gate structure.

\* \* \* \* \*